United States Patent
Udagawa et al.

(10) Patent No.: US 6,841,435 B2
(45) Date of Patent: Jan. 11, 2005

(54) METHOD FOR FABRICATING A GAINP EPITAXIAL STACKING STRUCTURE

(75) Inventors: Takashi Udagawa, Chichibu (JP); Masahiro Kimura, Chichibu (JP); Akira Kasahara, Chichibu (JP); Taichi Okano, Chichibu (JP)

(73) Assignee: Showa Denko K.K., Tokyo (JP)

( * ) Notice: Subject to any disclaimer, the term of this patent is extended or adjusted under 35 U.S.C. 154(b) by 25 days.

(21) Appl. No.: 10/190,835

(22) Filed: Jul. 9, 2002

(65) Prior Publication Data

US 2003/0008440 A1 Jan. 9, 2003

Related U.S. Application Data

(62) Division of application No. 09/662,587, filed on Sep. 15, 2000, now Pat. No. 6,462,361.
(60) Provisional application No. 60/159,652, filed on Oct. 18, 1999, provisional application No. 60/163,285, filed on Nov. 3, 1999, provisional application No. 60/166,758, filed on Nov. 22, 1999, and provisional application No. 60/174,824, filed on Jan. 7, 2000.

(30) Foreign Application Priority Data

| Sep. 28, 1999 | (JP) | 11-274358 |
| Sep. 30, 1999 | (JP) | 11-278719 |
| Oct. 7, 1999 | (JP) | 11-286234 |
| Dec. 27, 1999 | (JP) | 11-368635 |

(51) Int. Cl.[7] .............................................. H01L 21/00
(52) U.S. Cl. ........................ 438/167; 438/933; 438/169
(58) Field of Search .................................. 438/167, 933, 438/168–174; 257/194, 15, 615, 22, 191

(56) References Cited

U.S. PATENT DOCUMENTS 4,967,242 A 10/1990 Sonoda et al.
5,393,990 A * 2/1995 Kohn ........................... 257/12

FOREIGN PATENT DOCUMENTS

| EP | 0408001 A2 | 1/1991 |
| JP | 3-44038 | 2/1991 |
| JP | 6-45368 | 2/1994 |
| JP | 6-333832 | 12/1994 |
| JP | 8-17160 | 2/1996 |
| JP | 10-504685 | 5/1998 |
| JP | 10-247727 | 9/1998 |
| JP | 10-335350 | 12/1998 |

OTHER PUBLICATIONS

"$Ga_{0.51}In_{0.49}P$/GaAs HEMT's Exhibiting Good Electrical Performance at Cryogenic Temperatures" by Chan et al, IEEE Trans. Electron Devices, vol. 37, No. 10 (1990) pp. 2141–2147.

The Effect of Gate Recess Profile on Device Performance of $Ga_{0.51}In_{0.49}P/_{In0.2Ga0.8}As$ Doped–Channel FET's by Lu et al, IEEE. Trans. Electron Devices, vol. 46, No. 1(1999) pp. 48–54.

IEEE Trans. Electron Devices, No. 44, No. 9 (1997) pp. 1341–1348.

(List continued on next page.)

Primary Examiner—Thanh Nguyen
Assistant Examiner—Yennhu B Huynh
(74) Attorney, Agent, or Firm—Sughrue Mion, PLLC

(57) ABSTRACT

A GaInP epitaxial stacking structure and fabrication method thereof, and a FET transistor using this structure are provided wherein, stacked upon a GaAs single-crystal substrate are at least a buffer layer, a $Ga_ZIn_{1-Z}As$ ($0<Z\leq1$) channel layer, and a $Ga_YIn_{1-Y}P$ ($0<Y\leq1$) electron-supply layer joined to the channel layer, wherein the GaInP epitaxial stacking structure includes a region within the electron-supply layer wherein the gallium composition ratio (Y) decreases from the side of the junction interface with the channel layer toward the opposite side.

2 Claims, 7 Drawing Sheets

OTHER PUBLICATIONS

"Physics and Applications of Semiconductor Superlattices" Physical Society of Japan, Sep. 1986, pp. 18–20.

Journal of Crystal Growth, 55 (1981), pp. 255–262.

Journal of Crystal Growth, 55 (1981), pp. 246–254.

Semi–Insulating III–V Material, Shiva Pub. Ltd. Kent UK 1980, pp. 349–352.

"Illustrated Semiconductor Dictionary", Nikkan Kogyo Shimbumsha, Jan. 25, 1978, pp. 238.

"Measurement of the Conduction–Band Discontinuity of Molecular Beam Epitaxial Grown $In_{0.52}Al_{0.48}As/In_{0.53}Ga_{0.47}As$, N–n Heterojunction by C–V Profiling" by People et al., Appl. Phys. Lett. 43(1), 1983, pp. 118.

"Silicon Crystal Growth and Wafer Working", May 20, 1994, pp. 322–326.

Journal of Electron. Mat. 25(3) 1996, pp. 407–409.

Journal of Crystal Growth, 107, 1991 pp. 360–364.

Journal of Chemical Society, 1951, pp. 2003–2013.

Journal of Crystal Growth, Co. 221, No. 1–4, pp. 713–716, Dec. 2000, Metal–organic VPE growth of electron mobility enhanced GaInP/GaInAs pseudomorphic two–dimensional FET structure:, M. Kimura et al.

\* cited by examiner

METHOD FOR FABRICATING A GAINP EPITAXIAL STACKING STRUCTURE

CROSS REFERENCE TO RELATED APPLICATIONS

This application is a divisional of application Ser. No. 09/662,587 filed Sep. 15, 2000 now U.S. Pat. No. 6,462,361, incorporated herein by reference, claiming benefit pursuant to 35 U.S.C. §119(e) (1) of the filing dates of the Provisional Application Nos. 60/159,652, 60/163,285, 60/166,758, and 60/174,824 filed Oct. 18, 1999, Nov. 3, 1999, Nov. 22, 1999 and Jan. 7, 2000 pursuant to 35 U.S.C. §111(b), respectively, all of which are incorporated herein by reference in their entirety.

BACKGROUND OF THE INVENTION

1. Field of the Invention

This invention relates to a GaInP epitaxial stacking structure, and more specifically to a GaInP epitaxial stacking structure for FETs and a fabrication method thereof, which has electron-supply layers and spacer layers which give high-mobility characteristics, and a high-mobility field effect transistor using this structure.

2. Description of the Prior Art

Schottky junction-type field effect transistors (known as MESFETs) which operate in the microwave region or millimeter wave region include GaInP high electron mobility transistors (known as TEGFETs, MODFETs and the like) which utilize mixed crystals of gallium-indium phosphide ($Ga_AIn_{1-A}P$: $0 \leq A \leq 1$) (see *IEEE Trans. Electron Devices*, Vol. 37, No. 10 (1990), pp. 2141–2147). GaInP MODFETs can be used as low-noise MESFETs for signal amplification in the microwave region (see *IEEE Trans. Electron Devices*, Vol. 46, No. 1 (1999), pp. 48–54) and as power MESFETs for transmission applications (see *IEEE Trans. Electron Devices*, Vol. 44, No. 9 (1997), pp. 1341–1348).

FIG. 1 is a schematic diagram of the cross-sectional structure of a conventional GaInP TEGFET. The substrate 10 used is made of semi-insulating gallium arsenide (chemical formula: GaAs) with a {001} crystal plane as its primary plane. Upon the substrate 10 is deposited a buffer layer 11 consisting of a high-resistance Group III–V compound semiconductor layer. Upon the buffer layer 11 is deposited an electron transporting layer (channel layer) 12 consisting of n-type mixed crystals of gallium-indium arsenide ($Ga_ZIn_{1-Z}As$: $0<Z \leq 1$). A spacer layer may be deposited upon the channel layer 12, but particularly in power TEGFETs for transmission applications, an electron-supply layer 13 consisting of mixed crystals of gallium-indium phosphide ($Ga_YIn_{1-Y}P$: $0<Y \leq 1$) is deposited without an interposed spacer layer. The carrier (electron) density of the electron-supply layer 13 is adjusted by the intentional addition (doping) of silicon (Si) or other n-type impurities which are not readily diffused. Upon the electron-supply layer 13, a contact layer 14 consisting of n-type GaAs or the like is typically provided in order to form the low-contact resistance source electrode 15 and drain electrode 16. In addition, between the source and drain electrodes 15, 16, the contact layer 14 is partially removed to expose a recess structure, and a Schottky junction-type gate electrode 17 is provided, thereby constituting a TEGFET.

The various constituent layers 11–14 which constitute the GaInP epitaxial stacking structure 1A for MODFET application illustrated in FIG. 1, because of their ease of film formation, are conventionally formed by the metal-organic chemical vapor deposition (MOCVD) method (see ibid *IEEE Trans. Electron Devices*, Vol. 44 (1997)). Among these constituent layers, the electron-supply layer 13 is a functional layer for supplying electrons formed to accumulate as a two-dimensional electron gas (TEG) in the vicinity of the junction interface 12a of the channel layer 12. The electron-supply layer 13 is conventionally formed of gallium-indium phosphide ($Ga_YIn_{1-Y}P$: $0<Y \leq 1$) doped with silicon (the symbol of element: Si) or other n-type impurities which are not readily diffused (see ibid *IEEE Trans. Electron Devices*, Vol. 44 (1997)). The carrier density (units: $cm^{-3}$) of the electron-supply layer 13 is commonly made $1-3 \times 10^{18}$ $cm^{-3}$ or $2 \times 10^{18}$ $cm^{-3}$ in particular. The thickness of the layer is typically set within the range 10 nm to 40 nm. In addition, in a GaInP TEGFET, the n-type electron-supply layer is normally constituted from $Ga_YIn_{1-Y}P$ ($0<Y \leq 1$) layers wherein the gallium composition ratio (=Y) is fixed in the layer thickness direction.

In addition, in the structure wherein a spacer layer is deposited upon the channel layer 12, in order to prevent the two-dimensional electron gas from being disturbed due to ionization scattering from the channel layer 12, the spacer layer is a functional layer provided for the spatial isolation of the channel layer 12 and electron-supply layer 13 (see "Physics and Applications of Semiconductor Superlattices," Physical Society of Japan, ed. (published by Baifukan, Sep. 30, 1986, first edition, fourth printing), pp. 236–240). In a GaInP TEGFET, the spacer layer is typically constituted from undoped $Ga_XIn_{1-X}P$ ($0<X \leq 1$) (see ibid *IEEE Trans. Electron Devices*, Vol. 44 (1997)). Regardless of the case of GaInP TEGFET, spacer layers are constituted from high-purity undoped layers with a low total amount of impurities, and their layer thickness is typically in the range from 2 nanometers (nm) to 10 nm (see ibid "Physics and Applications of Semiconductor Superlattices," pp. 18–20).

For example, in a low-noise GaInP TEGFET, the noise-figure (NF) and other major properties vary depending on the electron mobility, so the higher the electron mobility, the lower the NF conveniently becomes. For this reason, in order to cause the electrons supplied from the n-type electron-supply layer 13 to accumulate as a two-dimensional electron gas in the interior regions of the $Ga_ZIn_{1-Z}As$ ($0<Z \leq 1$) in the vicinity of the junction interface with the spacer layer consisting of undoped $Ga_XIn_{1-X}P$ ($0<X \leq 1$), the composition at the junction interface between the channel layer 12 and the spacer layer must change abruptly and exhibit high electron mobility.

In addition, the formation of a buffer layer is typically performed by vapor deposition without varying the starting material species of gallium (element symbol: Ga). Since the admixture of carbon (element symbol: C) acceptors that electrically compensate residual donor components represented by silicon occurs readily, and a high-resistance GaAs layer or $Al_LGa_{1-L}As$ layer is easily obtained in the undoped state (see *J. Crystal Growth*, 55 (1981), pp. 255–262), trimethyl gallium (chemical formula: $(CH_3)_3Ga$) is used as the gallium (Ga) source (see *J. Crystal Growth*, 55 (1981), pp. 246–254, ibd, pp. 255–262, and PCT application publication No. 10-504685).

In a GaInP TEGFET for low-noise amplification, the noise-figure (NF) and other major properties vary depending on the two-dimensional electron mobility (units: $cm^2/V \cdot s$), so the higher the electron mobility ($cm^2/V \cdot s$), the lower the NF becomes. For this reason, in a low-noise TEGFET, the electron-supply layer which takes the role of supplying electrons must be constituted from $Ga_YIn_{1-Y}P$ ($0<Y \leq 1$) which can exhibit a high electron mobility. On the other hand, in a power TEGFET, from the standpoint of causing it to operate with a relatively large source-drain current flowing, a large sheet carrier density (units: cm$^{-2}$) is required together with the electron mobility. Therefore, electron-supply layer for power TEGFET applications must be constituted from a $Ga_YIn_{1-Y}P$ ($0<Y\leq1$) layer that exhibits a high sheet carrier density.

However, in the conventional electron-supply layer consisting of $Ga_YIn_{1-Y}P$ wherein the gallium composition ratio (=Y) or indium composition ratio (=1−Y) is roughly constant, at a relatively high sheet carrier density, there is a disadvantage in that a high electron mobility cannot be manifested stably. For this reason, in low-noise GaInP TEGFETs for example, a large transconductance ($g_m$) is not obtained, thus obstructing the stable supply of low-noise GaInP TEGFETs with a superior low noise-figure (NF).

A first object of the present invention is to provide a GaInP epitaxial stacking structure containing a $Ga_YIn_{1-Y}P$ ($0<Y\leq1$) electron-supply layer and fabrication method thereof for stably manifesting a high electron mobility in excess of 5000 cm$^2$/V·s at room temperature and at a relatively high sheet carrier density of $1.5\times10^{12}$ cm$^{-2}$ or greater and $2.0\times10^{12}$ cm$^{-2}$ or less. With this structure, low-noise GaInP high electron mobility transistors with superior transconductance properties and power GaInP TEGFETs with superior power transformation efficiency due to their high source-drain current can be provided.

In addition, in a structure wherein a spacer layer is provided between the channel layer and electron-supply layer, if a $Ga_XIn_{1-X}P$ spacer layer wherein the indium composition ratio (=1−X) is roughly constant is provided joined to the $Ga_ZIn_{1-Z}As$ ($0<Z\leq1$) channel layer 12, mutual diffusion occurs between phosphorus (element symbol: P) and arsenic (element symbol: As) in the vicinity of the junction interface 12a, so a problem occurs in that the steep change in composition at the junction interface 12a is worsened.

If the steepness of change in composition at the junction interface 12a is not achieved, a two-dimensional electron gas does not efficiently accumulate in the interior regions of the $Ga_ZIn_{1-Z}As$ channel layer 12, and the electron mobility drops. The electron mobility particularly affects the transconductance ($g_m$) of GaInP TEGFETs for low-noise amplification, and influences the noise-figure (NF) even more. At a low electron mobility, a high $g_m$ is not obtained and therefore, a GaInP TEGFET with a low NF is not obtained.

In addition, it was conventionally common for the spacer layer to be constituted from an undoped $Ga_XIn_{1-X}P$ ($0<X\leq1$) layer wherein the indium composition ratio is constant. However, the carrier density in the undoped state is roughly $1\times10^{16}$ cm$^{-3}$ at the lowest. Since the two-dimensional electron gas accumulates more efficiently by lowering the carrier density of the spacer layer, in order for a high electron mobility to be manifested, the spacer layer must be constituted from a $Ga_XIn_{1-X}P$ ($0<X\leq1$) layer with an even lower carrier density.

Thus, a second object of the present invention is to provide an epitaxial stacking structure comprising a spacer layer made of $Ga_XIn_{1-X}P$ ($0<X\leq1$) which can stably manifest an even higher electron mobility and has a low carrier density. With this structure, it is possible to provide a GaInP epitaxial stacking structure with excellent transconductance.

Irrespective of GaInP TEGFETs, the transconductance ($g_m$) and pinch-off characteristics of high electron mobility field effect transistors are known to fluctuate depending on the quality of the buffer layer. For example, in the normal AlGaAs/GaAs lattice-matched TEGFETs and AlGaAs/GaInAs strained-lattice TEGFETs, a high $g_m$ and good pinch-off characteristics are obtained, and the buffer layer is formed as a high-resistance layer with a low leakage current.

On the other hand, as described above, in a GaInP TEGFET comprising an electron-supply layer consisting of $Ga_YIn_{1-Y}P$ which is one type of a phosphorus- (element symbol: P) containing Group III–V compound semiconductor, simply making the buffer layer a high-resistance layer has conventionally had the problem wherein a homogenous $g_m$ and pinch-off voltage cannot be stably obtained. The present inventors discovered that this instability of properties derives from heterogeneity in the indium composition ratio (=1−Y) of the $Ga_YIn_{1-Y}P$ electron-supply layer due to differences in the gallium (Ga) source utilized in the formation of the buffer layer of a superlattice structure that uses AlGaAs and GaAs in particular as constituent layers.

In addition, in the buffer layers consisting of the conventional constitution such as AlGaAs/GaAs superlattice-structure buffer layers, there are problems regarding the DC properties (static properties) of the transistor in that fluctuation in the source-drain current value under illumination (so-called "photoresponsibility") (see G. J. Ree, ed., *Semi-Insulating III–V Materials*, (Shiva Pub. Ltd. (Kent, UK, 1980), pp. 349–352) and "hysteresis" of the source-drain current (see Makoto Kikuchi, Yasuhiro Tarui, eds., "Illustrated Semiconductor Dictionary," (Nikkan Kogyo Shimbunsha, Jan. 25, 1978), p. 238) and "kinks" easily occur (JP-A-10-247727 and JP-A-10-335350).

Therefore, a third object of the present invention is to provide an epitaxial stacking structure comprising a buffer layer for forming a $Ga_YIn_{1-Y}P$ ($0<Y\leq1$) electron-supply layer that has high resistance suitable for reducing the leakage current and that has a homogeneous indium composition.

In a GaInP TEGFET, the spacer layer is constituted from $Ga_XIn_{1-X}P$ ($0<X\leq1$) which is an indium-containing Group III–V compound semiconductor, and moreover it is constituted as a thin film. The conventional MOCVD technology has a problem in that thin-film spacer layers with a homogenous indium composition ratio (=1−X) cannot be stably obtained.

For this reason, conventional GaInP high electron mobility field effect transistors which use as the spacer layer a $Ga_XIn_{1-X}P$ ($0<X\leq1$) layer wherein the indium composition ratio is not sufficiently homogenous cannot maintain a homogenous band offset with the channel layer due to "fluctuation" in the indium composition ratio within the spacer layer, and for this reason, achieving a homogenous transconductance ($g_m$) and pinch-off voltage was difficult.

Therefore, a fourth object of the present invention is to provide an epitaxial stacking structure for TEGFET applications that has a $Ga_XIn_{1-X}P$ ($0<X\leq1$) spacer layer with a superior homogeneity in its indium composition. With this structure, it is possible to provide a GaInP high electron mobility transistor with superior homogeneity in its pinch-off voltage and other properties.

SUMMARY OF THE INVENTION

In order to achieve these objects, the present invention provides a GaInP epitaxial structure stacked upon a GaAs single-crystal substrate, comprising at least a buffer layer, a $Ga_ZIn_{1-Z}As$ ($0<Z\leq1$) channel layer, and a $Ga_YIn_{1-Y}P$ ($0<Y\leq1$) electron-supply joined to the channel layer, the GaInP epitaxial stacking structure including a region within the electron-supply layer wherein the gallium composition ratio (Y) decreases from the side of the junction interface with the channel layer toward the opposite side.

The gallium composition ratio of the aforementioned electron-supply layer is $Y \geq 0.51 \pm 0.01$.

In addition, the gallium composition ratio of the aforementioned electron-supply layer at the junction interface with the channel layer is $Y \geq 0.70$.

Moreover, the gallium composition ratio of the aforementioned electron-supply layer at the junction interface with the channel layer is $Y=1.0$.

Furthermore, at the junction interface between the aforementioned electron-supply layer and the channel layer, there is a region with a thickness in the range 1–20 nanometers wherein the gallium composition ratio is constant.

In accordance with another aspect, the invention provides a GaInP epitaxial structure upon a GaAs single-crystal substrate, comprising at least a buffer layer, a $Ga_ZIn_{1-Z}As$ ($0<Z\leq 1$) channel layer, a $Ga_XIn_{1-X}P$ ($0<X\leq 1$) spacer layer, and a $Ga_YIn_{1-Y}P$ ($0<Y\leq 1$) wherein the channel layer, spacer layer, and electron-supply layer join each other in this order, and the GaInP epitaxial stacking structure includes a region within the spacer layer wherein the gallium composition ratio (X) decreases from the side of the junction interface with the channel layer toward the side of the electron-supply layer.

The gallium composition ratio of the aforementioned electron-supply layer is $Y=0.51\pm 0.01$.

In addition, the gallium composition ratio of the aforementioned spacer layer at the junction interface with the channel layer is $X \geq 0.70$.

Moreover, the gallium composition ratio of the aforementioned spacer layer at the junction interface with the channel layer is $X=1.0$.

Furthermore, the gallium composition ratio of the aforementioned spacer layer at the junction interface with the channel layer is $X=0.51\pm 0.01$.

In addition, a boron-doped n-type layer constitutes the aforementioned spacer layer.

Furthermore, the aforementioned buffer layer consists of a periodic structure of a plurality of $Al_LGa_{1-L}As$ ($0\leq L\leq 1$) layers with different aluminum composition ratios (L) vapor-deposited using an organic methyl compound of aluminum or gallium as its starting material, having an $Al_MGa_{1-M}As$ ($0\leq M\leq 1$) layer vapor-deposited or the periodic structure using an organic ethyl compound of aluminum or gallium as its starting material.

In addition, the relationship $0.9 \leq K \leq 1.0$ holds true for the compensation ratios (K) ($K=N_a/N_d$ (if $N_a\leq N_d$) and $K=N_d/N_a$ (if $N_d<N_a$); $N_a$: acceptor density of the constituent layer, $N_d$: donor density of the constituent layer) of the constituent layers of the periodic structure.

The aforementioned periodic structure consists of an $Al_LGa_{1-L}As$ ($0\leq L\leq 1$) layer and a p-type GaAs layer, and the carrier density of each constituent layer is $1\times 10^{15}$ cm$^{-3}$ or less.

In addition, the aforementioned $Al_MGa_{1-M}As$ layer is touching the channel layer.

Moreover, the aforementioned $Al_MGa_{1-M}As$ layer has a carrier density of $5\times 10^{15}$ cm$^{-3}$ or less, thickness of 100 nm or less and consists of an n-type layer.

Furthermore, the thickness of the aforementioned $Al_MGa_{1-M}As$ layer is less than the thickness of the constituent layers of the periodic structure.

In addition, the aluminum composition ratio (M) of the aforementioned $Al_MGa_{1-M}As$ layer is less than the aluminum composition ratio (L) of the $Al_LGa_{1-L}As$ layers which constitute the periodic structure.

Moreover, the aforementioned buffer layer comprises an $Al_LGa_{1-L}As$ ($0\leq L\leq 1$) layer vapor-deposited using a trimethyl compound of a Group III element as its starting material, a GaAs layer vapor-deposited using triethyl gallium as the starting material for gallium is disposed between the buffer layer and channel layer, the channel layer has a conduction type of n-type, the spacer layer and electron-supply layer are n-type layers vapor-deposited using trimethyl gallium as the starting material for gallium, the homogeneity in the indium composition ratio within each of the spacer layer and electron-supply layer is ±2% or less, and the spacer layer and electron-supply layer are touching each other.

In addition, the surface roughness (haze) after formation of the aforementioned channel layer is 60 ppm or less, and the channel layer touches a GaAs layer vapor-deposited using triethyl gallium as the starting material for gallium.

Furthermore, the aforementioned spacer layer and channel layer touch each other, and the surface roughness (haze) after formation of the spacer layer is 100 ppm or less.

In addition, the surface roughness (haze) after formation of the electron-supply layer is 200 ppm or less.

In accordance with another aspect, the present invention provides a method of fabricating a GaInP epitaxial stacking structure comprising: a step wherein the buffer layer is vapor-deposited using an organic methyl compound of aluminum or gallium as its starting material, a step wherein the AlGaAs layer is vapor-deposited using an organic ethyl compound of aluminum or gallium as its starting material in contact with the periodic structure, and a step wherein the channel layer and electron-supply layer are formed by means of a chemical vapor deposition method using cyclopentadienyl indium which has a bond valence of monovalent as the starting material for indium.

In accordance with another embodiment, the present invention provides a method of fabricating a GaInP epitaxial stacking structure comprising: a step wherein the buffer layer is vapor-deposited using an organic methyl compound of aluminum or gallium as its starting material, a step wherein the $Al_MGa_{1-M}As$ ($0\leq M\leq 1$) layer is vapor-deposited using an organic ethyl compound of aluminum or gallium as its starting material in contact with the periodic structure, and a step wherein the channel layer, spacer layer and electron-supply layer are formed by means of a chemical vapor deposition method using cyclopentadienyl indium which has a bond valence of monovalent as the starting material for indium.

Moreover, the present invention also comprises a field effect transistor fabricated using the aforementioned GaInP epitaxial stacking structure.

As described above, the present invention constitutes the electron-supply layer as a $Ga_YIn_{1-Y}P$ layer with a gradient in the composition such that the gallium composition ratio decreases in the direction of increasing layer thickness from the channel layer toward the contact layer, so a two-dimensional electron gas efficiently accumulates in the interior of the channel layer, and a high electron mobility is manifested, so a GaInP epitaxial stacking structure with a superior homogeneity in the transconductance and pinch-off voltage can be provided.

In addition, as described above, the present invention constitutes the spacer layer as a $Ga_XIn_{1-X}P$ layer with a gradient in the composition such that the gallium composition ratio decreases in the direction of increasing layer thickness from the channel layer toward the contact layer, so a two-dimensional electron gas efficiently accumulates in the interior of the channel layer, and a high electron mobility is manifested, so a GaInP epitaxial stacking structure with a superior homogeneity in the transconductance and pinch-off voltage can be provided.

Moreover, as described above, the present invention constitutes the superlattice periodic structure constituting one part of the buffer layer with a periodic alternating layer structure of $Al_L Ga_{1-L} As$ layers vapor-deposited using an organic methyl compound as its starting material and with a stipulated compensation ratio, so a GaInP epitaxial stacking structure with a low leakage current can be provided.

Furthermore, the constitution is such that an indium-containing Group III–V compound is provided with a GaAs thin-film layer vapor-deposited from triethyl gallium as its starting material, so a $Ga_Z In_{1-Z} As$ channel layer, a $Ga_X In_{1-X} P$ spacer layer, and an electron-supply layer with superior homogeneity in indium composition can be formed, and therefore, a GaInP epitaxial stacking structure with a superior homogeneity in the transconductance and pinch-off voltage can be provided.

The above and other objects and features of the invention will become apparent from the following description made with reference to the drawings.

DESCRIPTION OF THE PREFERRED EMBODIMENTS

Figure 5:
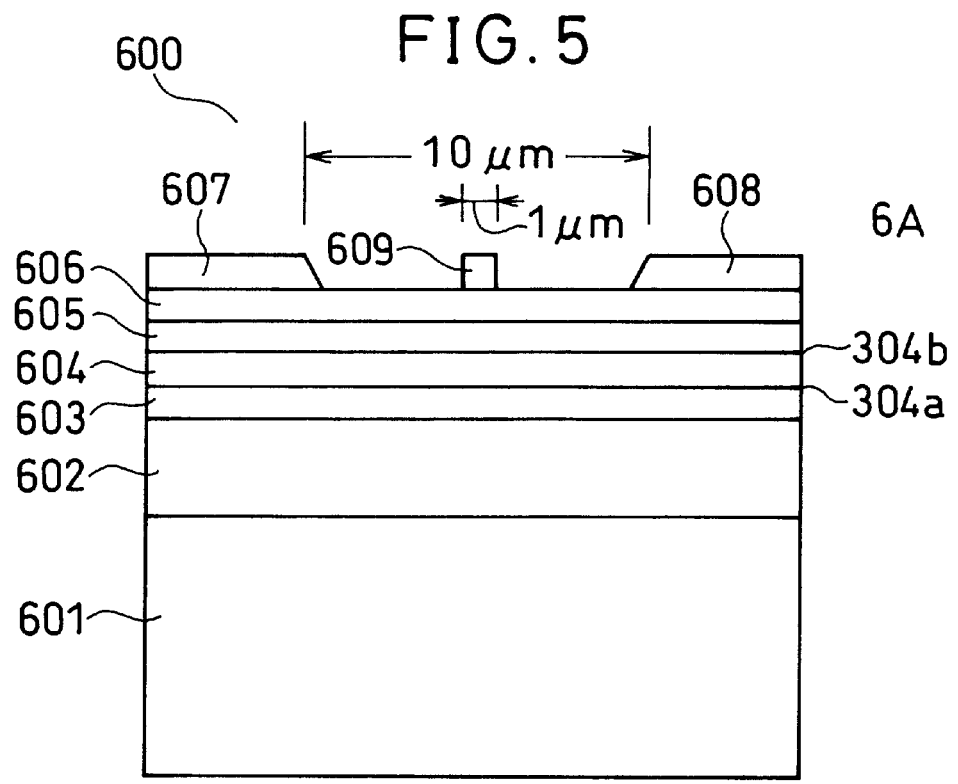
FIG. 5 is a schematic cross section of a GaInP TEGFET used to explain a preferred embodiment of the present invention.

The basic constitution of the epitaxial stacking structure for GaInP FETs according to the present invention has a structure stacked upon the surface of a GaAs single crystal 301, comprising at least a buffer layer 302, a $Ga_Z In_{1-Z} As$ (0<Z≦1) channel layer 303 and a $Ga_Y In_{1-Y} P$ (0<Y≦1) electron-supply layer 304 provided joined to this channel layer (FIG. 3) or has a structure stacked upon the surface of a GaAs single crystal 601, comprising at least a buffer layer 602, a $Ga_Z In_{1-Z} As$ (0<Z≦1) channel layer 603, a $Ga_X In_{1-X} P$ (0<X≦1) space layer 604 provided joined to this channel layer and a $Ga_Y In_{1-Y} P$ (0<Y≦1) electron-supply layer 605 provided joined to this spacer layer (FIG. 5).

It is preferable that a semi-insulating {001} substrate in particular be used as the GaAs single-crystal substrate.

In the first preferred embodiment according to claim 1 of the present invention, the $Ga_Y In_{1-Y} P$ (0<Y≦1) electron-supply layer may be formed by means of atmospheric-pressure or low-pressure MOCVD or other vapor-deposition method using trimethyl gallium (chemical formula: $(CH_3)_3 Ga$) as the gallium (Ga) source, trimethyl indium (chemical formula: $(CH_3)_3 In$) as the indium (In) source and phosphine (chemical formula: $PH_3$) as the phosphorus (P) source, for example. Triethyl gallium (chemical formula: $(C_2H_5)_3 Ga$) can also be used as the gallium (Ga) source. The $Ga_Y In_{1-Y} P$ layer may be formed using a $(CH_3)_3 Ga/C_5 H_5 In/PH_3$ MOCVD reaction using cyclopentadienyl indium (chemical formula: $C_5 H_5 In$) (see JP-A-8-17160) as the indium (In) source, for example. The $Ga_Y In_{1-Y} P$ electron-supply layer (gradient-composition layer) with a gradient in the gallium composition such that the gallium composition ratio (Y) decreases in the direction of increasing layer thickness from the junction interface with the $Ga_Z In_{1-Z} As$ (0<Z≦1) channel layer can be formed by reducing the amount (concentration) of the gallium source provided to the MOCVD reaction system with increasing film deposition time while maintaining a constant amount (concentration) of the indium source supplied to the MOCVD reaction system. In addition, film formation can be performed by increasing the amount of the indium source supplied together with increasing film deposition time while maintaining a constant amount of the gallium source supplied to the MOCVD reaction system. In addition, in order to obtain an electron-supply layer with the desired carrier density, it is preferable to perform doping with silicon (Si) or the like during deposition.

Figure 1:
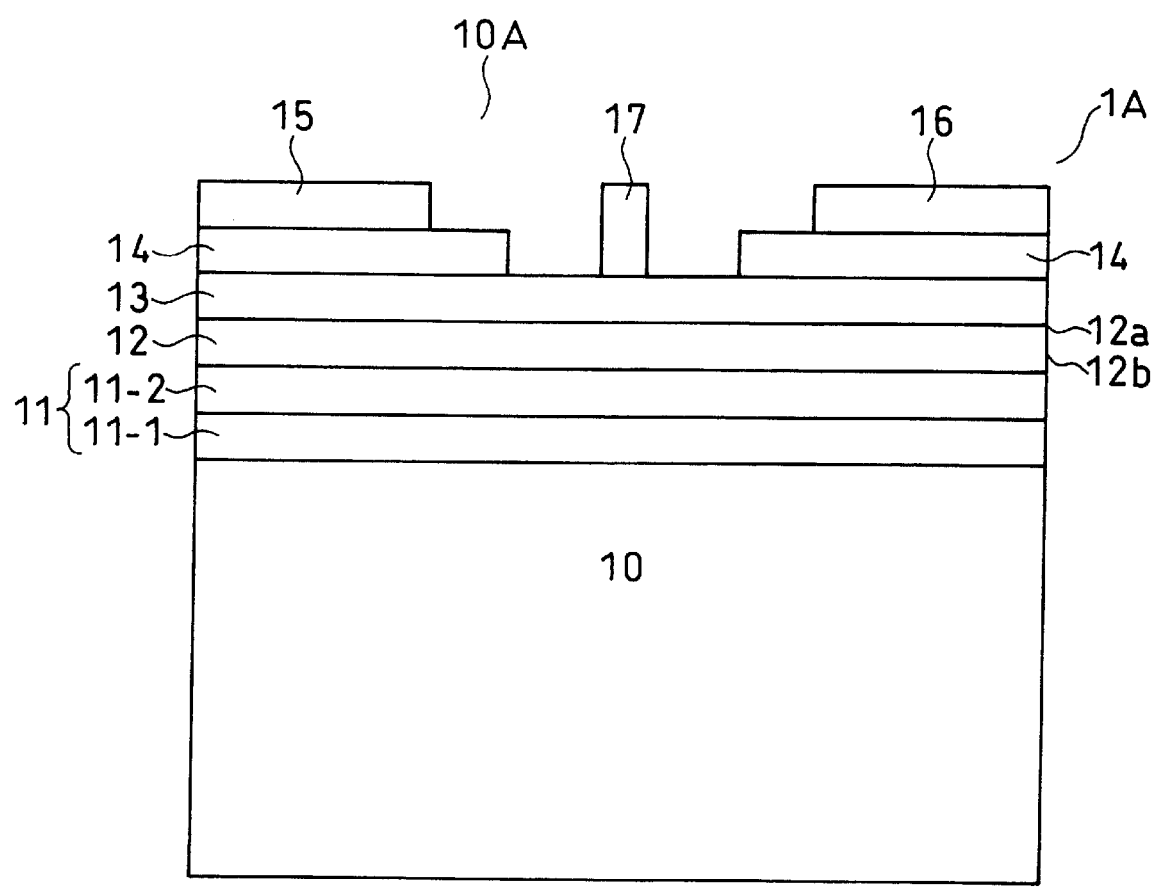
FIG. 1 is a schematic cross section of the structure for a conventional GaInP TEGFET.
Figure 2:
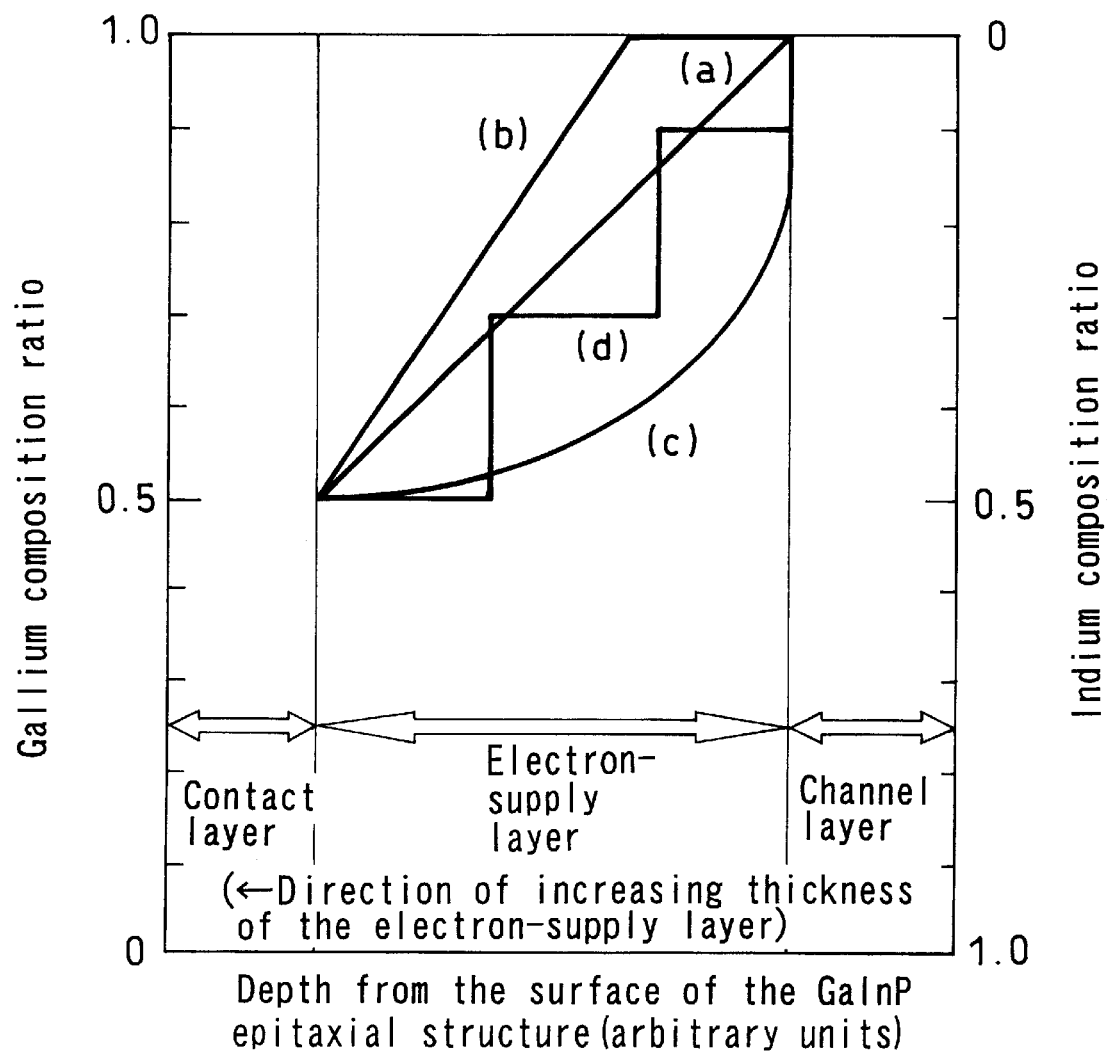
FIG. 2 is a chart illustrating the pattern of the gradient in gallium composition for the $Ga_Y In_{1-Y} P$ gradient-composition electron-supply layer.

FIG. 2 schematically illustrates the pattern of the gradient in gallium composition in the interior of the electron-supply layer consisting of a $Ga_Y In_{1-Y} P$ gradient-composition layer. The gradient pattern in the gallium composition illustrated in FIG. 2 is one example of the gradient-composition pattern allowable by the present invention, and in this figure, (a) shows the change in the gallium composition when the gallium composition is varied uniformly and linearly together with the increase in the thickness of the electron-supply layer. The symbol (b) shows the gradient pattern in the case in which the gallium composition is kept constant in the vicinity of the junction interface with the channel layer and then the gallium composition is reduced uniformly and linearly. In addition, the symbol (c) shows an example in the case in which the gallium composition is reduced in a curved manner. In addition, the symbol (d) is a gradient pattern in the case in which the gallium composition is reduced in a step-wise manner.

The gradient pattern is not limited to the patterns illustrated in FIG. 2, but in the third preferred embodiment according to claim 3 of the present invention, the gallium composition ratio (=Y) of the $Ga_Y In_{1-Y} P$ electron-supply layer at the junction interface with the $Ga_Z In_{1-Z} As$ (0<Z≦1) channel layer is 0.70 or greater or preferably 0.85 or greater. This is because, by making the gallium composition ratio (=Y) 0.70 or greater, the mobility of the two-dimensional electron gas accumulated in the channel layer can be increased. If the gradient pattern for the gallium composition shown by symbol (d) in FIG. 2 is followed, for example, the gallium composition ratio (=Y) may be made 0.90 in the region wherein the thickness from the junction interface with the channel layer is up to 2 nm, and next the gallium composition ratio can be made 0.70 in another 2-nm thick region, and then another 2-nm thick region with a gallium composition of 0.51 can be used to give a multi-layer constitution of individual $Ga_YIn_{1-Y}P$ layers, and by thus reducing the gallium composition layer step-wise by 0.2, an electron-supply layer having a gradient composition according to this preferred embodiment can be formed.

Particularly in the fourth preferred embodiment according to claim 4 of the present invention, the gallium composition ratio (=Y) of the $Ga_YIn_{1-Y}P$ electron-supply layer at the junction interface with the $Ga_ZIn_{1-Z}As$ (0<Z≦1) channel layer is set to 1.0. Setting the gallium composition ratio to 1.0 namely makes the electron-supply layer gallium phosphide (chemical formula: GaP). If the gradient pattern for the gallium composition shown by symbol (b) in FIG. 2 is followed, for example, the gallium composition ratio (=Y) may be set to 1.0 in the region wherein the thickness from the junction interface with the channel layer is up to 2 nm, and then the gallium composition ratio can be reduced linearly to 0.51 so that an electron-supply layer having a gradient composition according to this preferred embodiment can be formed. By setting the gallium composition ratio to 1.0 at the junction interface with the channel layer, a high junction barrier with the $Ga_ZIn_{1-Z}As$ channel layer is formed so that a two-dimensional electron gas can be efficiently accumulated.

In the second preferred embodiment according to claim 2 of the present invention, in the gradient-composition layer consisting of $Ga_YIn_{1-Y}P$ with a pattern wherein the gallium composition ratio (=Y) decreases with increasing layer thickness, the minimum gallium composition ratio (=Y) reached when decreasing is set to 0.51±0.01. For example, consider forming an electron-supply layer from an n-type $Ga_YIn_{1-Y}P$ gradient-composition layer wherein the gallium composition ratio (=Y) is decreased from 1.0 to 0.51. Since $Ga_YIn_{1-Y}P$ with a gallium composition ratio of 0.51±0.01 has a lattice that roughly matches that of gallium arsenide (GaAs), even if a contact layer consisting of GaAs is stacked upon the $Ga_YIn_{1-Y}P$ electron-supply layer, it has an advantage in that it is possible to prevent deterioration of the crystallinity of the electron-supply layer arising from mismatch of lattices.

In the fifth preferred embodiment according to claim 5 of the present invention, an n-type $Ga_YIn_{1-Y}P$ layer wherein the gallium composition ratio (=Y) is constant with a thickness in the range from 1–20 nanometers (units: nm) is provided in the region of the junction interface between the electron-supply layer and the channel layer. By providing a $Ga_YIn_{1-Y}P$ layer with a constant gallium composition ratio (=Y) in contact with the $Ga_ZIn_{1-Z}As$ (0<Z≦1) channel layer, the height of the barrier with the channel layer can be homogeneously stabilized. If the thickness of the aforementioned region with a constant gallium composition ratio becomes excessively thick, problems arising from mismatches with the lattice of the $Ga_ZIn_{1-Z}As$ (0<Z≦1) channel layer become conspicuous, and it becomes difficult to obtain a $Ga_YIn_{1-Y}P$ electron-supply layer with superior homogeneity of the indium (In) composition. In a typical electron-supply layer with a thickness of 10 nm–40 nm, in order to obtain stably a $Ga_YIn_{1-Y}P$ electron-supply layer with superior homogeneity of the indium composition and with also a superior surface state and the like, the aforementioned thickness of the $Ga_YIn_{1-Y}P$ layer with a constant gallium composition is preferably in the range 1–20 nm, more preferably in the range 1–10 nm and most preferably in the range 1–5 nm.

Note that in an extremely thin film wherein the thickness of the $Ga_YIn_{1-Y}P$ layer with a constant gallium composition ratio (=Y) is extremely thin at less than 1 nm, because of instability in the control of the gallium composition (=Y), an enlarged junction barrier cannot be obtained stably at the junction interface with the channel layer. The height of the junction barrier can be measured by means of the capacitance-voltage (C-V) method that utilizes Schottky junction electrodes (see *Appl. Phys. Lett.*, 43(1) (1983), p. 118).

The effect of the gradient pattern of the gallium composition according to the fifth preferred embodiment upon the improvement in the surface state of the $Ga_YIn_{1-Y}P$ electron-supply layer is compared against the prior art by means of the "haze" of the surface (see Takao Abe, "Silicon Crystal Growth and Wafer Working," (published by Baifukan, May 20, 1994, first edition), pp. 322–326). For example, while an n-type $Ga_{0.51}In_{0.49}P$ electron-supply layer with a gallium composition ratio of 0.51 stacked upon an n-type $Ga_{0.80}In_{0.20}As$ channel layer to a total thickness of 25 nm had a "haze" of the surface after deposition of 500–600 parts per million (ppm), if the fifth preferred embodiment is followed to make the gallium composition ratio (=Y) 1.0 in a 5-nm region from the junction interface with the $Ga_{0.80}In_{0.20}As$ channel layer, and then it is decreased to 0.51 with the increase in thickness until a total thickness of 25 nm is reached, thus forming an electron-supply layer constituting a $Ga_YIn_{1-Y}P$ gradient-composition layer, the "haze" of the surface after deposition was improved to 50–60 parts per million (ppm).

In the sixth preferred embodiment according to claim 6 of the present invention, the $Ga_XIn_{1-X}P$ (0<X≦1) spacer layer may be formed by means of atmospheric-pressure or low-pressure MOCVD or other vapor-deposition means using trimethyl gallium (chemical formula: $(CH_3)_3Ga$) as the gallium (Ga) source, trimethyl indium (chemical formula: $(CH_3)_3In$) as the indium (In) source and phosphine (chemical formula: $PH_3$) as the phosphorus (P) source, for example. Triethyl gallium (chemical formula: $(C_2H_5)_3Ga$) can also be used as the gallium (Ga) source. The $Ga_XIn_{1-X}P$ layer may be formed using a $(CH_3)_3Ga/C_5H_5In/PH_3$ MOCVD reaction using cyclopentadienyl indium (chemical formula: $C_5H_5In$) (see JP-B-8-17160) as the indium (In) source, for example. The $Ga_XIn_{1-X}P$ spacer layer (gradient-composition layer) with a gradient in the gallium composition such that the gallium composition ratio (X) decreases in the direction of increasing layer thickness from the junction interface with the $Ga_ZIn_{1-Z}As$ (0<Z≦1) channel layer can be formed by reducing the amount (concentration) of the gallium source provided to the MOCVD reaction system with increasing film formation time while maintaining a constant amount (concentration) of the indium source supplied to the MOCVD reaction system. In addition, film formation can be performed by increasing the amount of the indium source supplied together with increasing film formation time while maintaining a constant amount of the gallium source supplied to the MOCVD reaction system.

A $Ga_YIn_{1-Y}P$ (0<Y≦1) electron-supply layer is provided in contact with the spacer layer. In consideration of matching the lattice of the GaAs substrate, the electron-supply layer should preferably have an indium composition ratio (1−Y) set to 0.49 (or more strictly 0.485) and a gallium composition ratio (Y) set to 0.51 as shown in the preferred embodiment recited in claim 7.

Figure 4:
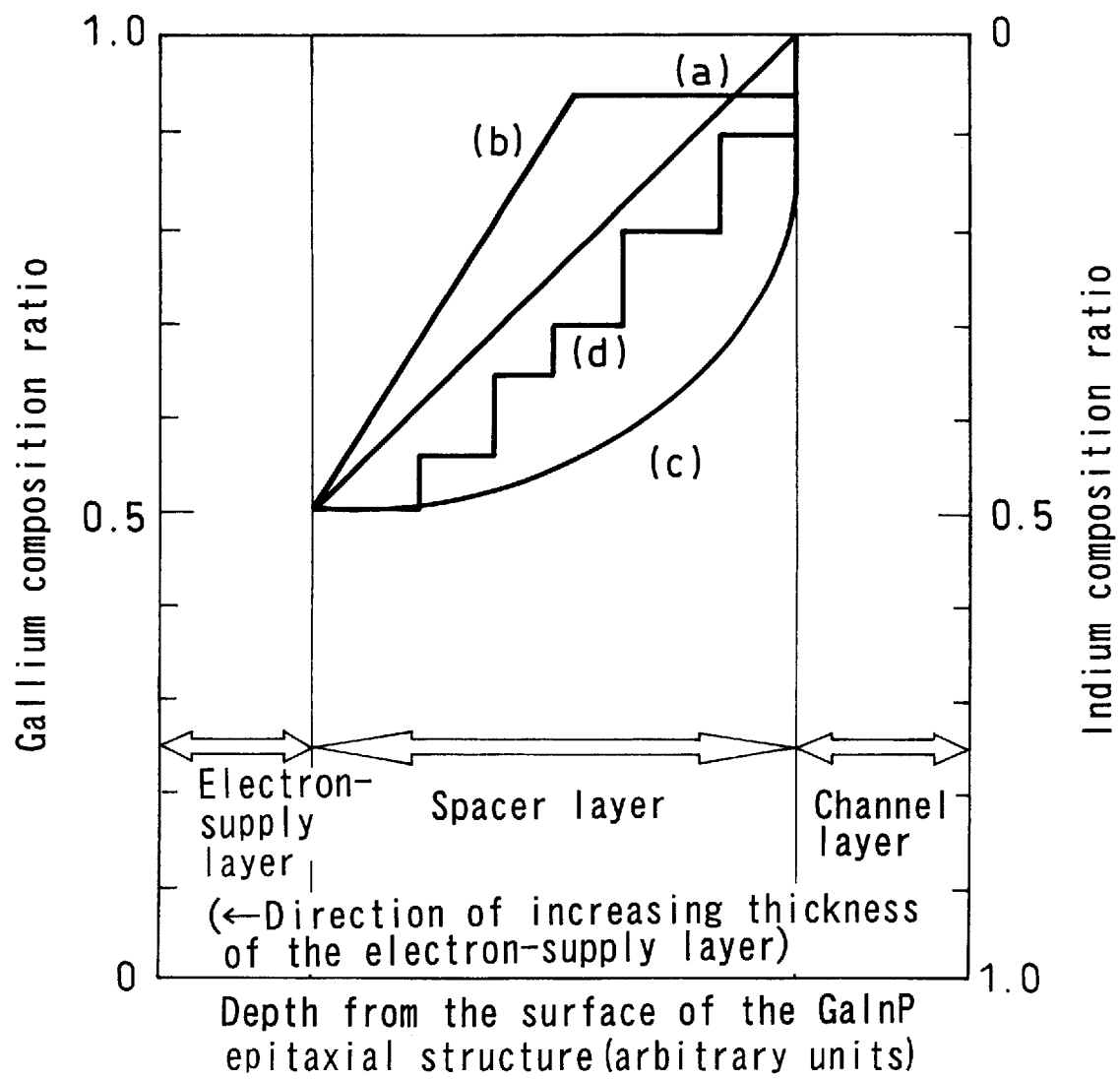
FIG. 4 is a chart illustrating the pattern of the gradient in gallium composition for the $Ga_X In_{1-X} P$ gradient-composition spacer layer.

FIG. 4 schematically illustrates the pattern of the gradient in gallium composition in the interior of the $Ga_XIn_{1-X}P$ gradient-composition spacer layer. The gradient pattern in the gallium composition illustrated in FIG. 4 is one example of the composition gradient patterns allowable by the present invention, and in this figure, (a) shows the change in the gallium composition when the gallium composition is varied uniformly and linearly together with the increase in the thickness of the spacer layer. The symbol (b) shows the gradient pattern in the case in which the gallium composition is kept constant from the junction interface with the channel layer and then the gallium composition is gradually reduced uniformly and linearly. For example, in a $Ga_xIn_{1-x}P$ spacer layer with a thickness of 7 nm, the gallium composition is kept constant in the region up until the thickness from the junction surface with the channel layer becomes 2 nm, and thereafter there is a means of giving a gradient composition wherein the gallium composition is reduced. The symbol (c) shows an example in the case in which the gallium composition is reduced in a curved manner. In addition, the symbol (d) is a gradient pattern in the case in which the gallium composition is reduced in a step-wise manner. For example, the gallium composition ratio (=X) may be made 0.90 in the region wherein the thickness from the junction interface with the channel layer is up to 2 nm, and next the gallium composition ratio can be made 0.70 in another 2-nm thick region, and then another 2-nm thick region with a gallium composition of 0.51 can be used to give a multi-layer constitution of individual $Ga_YIn_{1-Y}P$ layers, and by thus reducing the gallium composition layer step-wise by 0.2, a gradient-composition spacer layer can be formed.

The gradient pattern is not limited to the patterns illustrated in FIG. 4, but in any of the gradient patterns, as recited in the preferred embodiments according to claims 8–10 of the present invention, the gallium composition ratio (=X) of the $Ga_xIn_{1-x}P$ spacer layer at the junction interface with the $Ga_ZIn_{1-Z}As$ ($0<Z\leq1$) channel layer is preferably 0.70 or greater, more preferably 0.85 or greater, and even more preferably 1.0. This is because, by making the gallium composition ratio (=X) 0.70 or greater, the mobility of the two-dimensional electron gas accumulated in the channel layer can be increased. In addition, the gallium composition ratio should preferably decrease up to the vicinity of 0.51. This is because if lattice matching with the $Ga_{0.51}In_{0.49}P$ forming the electron-supply layer is achieved, then a spacer layer with superior crystallinity suited to accumulating the electrons supplied from the electron-supply layer as a two-dimensional electron gas in the $Ga_ZIn_{1-Z}As$ ($0<Z\leq1$) channel layer can be constituted.

Table 1 shows the mobility of a GaInP TEGFET which has a $Ga_xIn_{1-x}P$ spacer layer with a gradient in the gallium composition (=X) according to the present invention, compared against that of a typical conventional GaInP TEGFET having a $G_{0.51}In_{0.49}P$ layer with a gallium composition ratio of 0.51 as the spacer layer.

Among the TEGFETs according to the present invention listed in Table 1, regarding the gallium composition ratio of the spacer layer for example, the notation "0.75→0.51" means that the gallium composition ratio of 0.75 at the junction interface with the channel layer is reduced to 0.51 at the junction interface with the electron-supply layer. As shown in this table, with a GaInP TEGFET provided with a gradient-composition spacer layer according to the present invention, even at roughly the same sheet carrier density, a mobility higher than that of the prior art is exhibited at both room temperature (300 Kelvin (K)) and the temperature of liquid nitrogen (77K). In passing, both the mobility and sheet carrier density can be measured by the ordinary Hall effect measurement method. To wit, a $Ga_xIn_{1-x}P$ spacer layer with a gradient in the gallium composition and a gallium composition ratio at the junction interface with the carrier layer has the meritorious effect of exhibiting high mobility.

In particular, as shown in the ninth preferred embodiment according to claim 9 of the present invention, the $Ga_xIn_{1-x}P$ gradient-composition spacer layer wherein the gallium composition ratio (=X) at the junction interface with the $Ga_ZIn_{1-Z}As$ ($0<Z\leq1$) channel layer is set to 1.0, namely it is made to be gallium phosphide (chemical formula: GaP), gives a particularly high mobility. Even in this case, it is preferable that the gallium composition ratio at the junction interface with the $Ga_{0.51}In_{0.49}P$ electron-supply layer be 0.51. To wit, a $Ga_xIn_{1-x}P$ spacer layer which is preferable in the ninth preferred embodiment is a crystal layer wherein the gallium composition ratio (=X) is decreased from 1.0 to 0.51 when going from the junction interface with the channel layer to the junction interface with the electron-supply layer. A $Ga_xIn_{1-x}P$ spacer layer (X=1.0→0.51) with such a gradient composition is obtained by forming a GaP layer while supplying none of the indium source to the MOCVD reaction system at the start of film formation and thereafter, gradually increasing the amount of the indium source supplied to the reaction system so that the gallium composition becomes 0.51.

In addition, in the eleventh preferred embodiment according to claim 11 of the present invention, the n-type $Ga_xIn_{1-x}P$ gradient-composition spacer layer is constituted from n-type $Ga_xIn_{1-x}P$ ($0.51\leq X\leq1.0$) doped with boron (element symbol: B). The boron-doped $Ga_xIn_{1-x}P$ gradient-composition layer is formed with a gradient in the gallium composition, and it can be formed while supplying the boron source into the MOCVD system. Examples of the sources of boron for doping include trimethylboron (chemical formula: $(CH_3)_3B$) and triethylboron (chemical formula: $(C_2H_5)_3B$). Boron is preferably doped such that the boron atom density is $1\times10^{16}$ atoms/$cm^{-3}$ or greater and $1\times10^{18}$ atoms/$cm^{-3}$ or less. Furthermore, the boron doping should preferably be performed to an atom density that exceeds the approximate

TABLE 1

| Type of GaInP TEGFET | Ga composition ratio in $Ga_xIn_{1-x}P$ spacer layer (X) | Sheet carrier density (Units: x $10^{12}$ $cm^{-2}$) | | Mobility (Units: x $10^3$ $cm^3$/Vs) | |
|---|---|---|---|---|---|
| | | Room temperature | 77 K | Room temperature | 77 K |
| Prior art | 0.51 | 1.9 | 1.6 | 4.2 | 14 |
| Prior art | 0.51 | 1.7 | 1.4 | 4.4 | 17 |
| Present invention | 0.75→0.51 | 1.8 | 1.5 | 5.5 | 21 |
| Present invention | 0.85→0.51 | 1.9 | 1.7 | 6.0 | 23 | carrier density of the $Ga_XIn_{1-X}P$ gradient-composition layer. The boron atom density in the interior of the $Ga_XIn_{1-X}P$ gradient-composition layer can be adjusted with the amount of the source of boron for doping supplied to the MOCVD reaction deposition system. In addition, the boron atom density (units: atoms/cm$^{-3}$) in the interior of the $Ga_XIn_{1-X}P$ gradient-composition layer can be measured using ordinary secondary ion mass spectrometry (SIMS).

With boron doping, the carrier density of the $Ga_XIn_{1-X}P$ layer which is a gradient-composition layer can be reduced. For example, the carrier density of the $Ga_XIn_{1-X}P$ gradient-composition layer which is approximately $5 \times 10^{17}$ atoms/cm$^{-3}$ in the undoped state can be reduced by one or more orders of magnitude by boron doping. To wit, the gradient-composition layer can be made a layer with a higher electrical resistance. Thereby, the two-dimensional electron gas accumulated within the $Ga_ZIn_{1-Z}As$ ($0<Z \leq 1$) channel layer can be reduced to the degree of received ionization scattering, and therefore, since a high electron mobility becomes manifested, and a GaInP TEGFET with a superior transconductance (g,) property can be provided.

Figure 6:
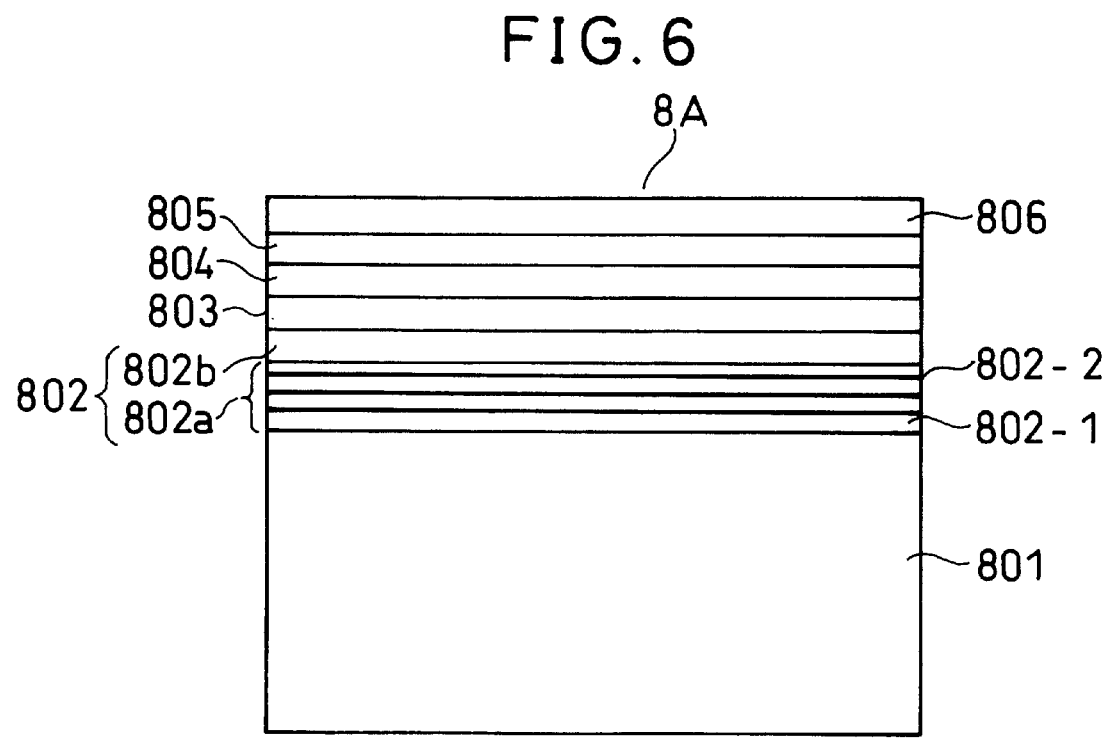
FIG. 6 is a schematic cross section of a GaInP epitaxial stacking structure used to explain a preferred embodiment of the present invention.

FIG. 6 is a schematic cross section of the epitaxial stacking structure 8A for conceptually explaining the twelfth preferred embodiment according to claim 12 of the present invention. In the working of this embodiment, a semi-insulating GaAs single crystal with a {100} crystal plane as its primary plane can be used as the substrate 801. A semi-insulating GaAs single crystal with a {100} plane as its primary plane which has a surface inclined by an angle of roughly ±10° in the [110] crystal direction from the {100} plane can also be used as the substrate 801. In addition, a GaAs single crystal with a room-temperature resistivity (specific resistance) of $10^7$ ohm-centimeter (units: $\Omega \cdot cm$) can be preferably used as the substrate 801.

Upon the surface of the substrate 801 is deposited a superlattice period structure 802a consisting preferably of an undoped $Al_LGa_{1-L}As$ ($0 \leq L \leq 1$) layer vapor-deposited by the MOCVD method using trimethyl gallium (($CH_3$)$_3$Ga) or other trialkyl gallium compound as the gallium source, thus constituting one part 802a of the buffer layer 802. The methyl groups added to the trimethyl gallium compound become the source of carbon impurities admixed into the interior of the $Al_LGa_{1-L}As$ ($0 \leq L \leq 1$) layer, thereby electrically compensating for residual donors within the layer, and having the meritorious effect of giving an $Al_LGa_{1-L}As$ ($0 \leq L \leq 1$) layer which has a high resistance in the undoped state. Therefore, if a trimethyl gallium compound is used as the starting material, a high-resistance buffer layer can be readily constituted. Even with a gallium compound which is a trialkyl gallium compound with three added hydrocarbon groups wherein two added groups are methyl groups, a similar meritorious effect may be obtained, but the efficacy is weaker than that of a trimethyl gallium compounds. In the event that a diethyl methyl gallium compound is used as the gallium source, for example, the efficacy of the adoption of high resistance due to the electrical compensation effect of carbon impurities becomes even weaker.

The superlattice structure 802a is constituted by periodical stacking of $Al_LGa_{1-L}As$ ($0 \leq L \leq 1$) layers with mutually differing aluminum composition ratios (=L). It can be constituted with a periodically stacked structure of $Al_{0.3}Ga_{0.7}As$ which has an aluminum composition ratio of 0.3 and GaAs which has an aluminum composition ratio equivalent to 0, for example. In addition, it can be constituted with a periodically stacked structure of $Al_{0.1}Ga_{0.9}As$ and aluminum arsenide (chemical formula: AlAs), for example. In a periodically stacked structure with a multi-layer structure consisting of two layers with different aluminum composition ratios as a unit, the appropriate thickness of the constituent layers 802-1 and 802-2 is 10 nanometers (units: nm) or greater and 100 nm or less. The number of stacking periods is preferably 2 or greater and more preferably 5 or greater. A high-resistance buffer layer consisting of a superlattice structure with a heterojunction constitution constituting 5 or more stacking periods of multi-layer units consisting of $Al_LGa_{1-L}As$ ($0 \leq L \leq 1$) layers with different aluminum composition ratios has a meritorious effect of suppressing the propagation of dislocations or the like from the substrate 801 to the channel layer 803 and other upper layers, and thus gives the effect of providing a $Ga_ZIn_{1-Z}As$ channel layer 803 with a low crystalline defect density and high quality, and that has a superior surface flatness.

The $Al_LGa_{1-L}As$ ($0 \leq L \leq 1$) layers made from organic ethyl compounds as starting materials which constitute the other portions 802b of the buffer layer 802 provided joined to the superlattice structure can be deposited using triethyl gallium (chemical formula: ($C_2H_5$)$_3$Ga) and triethyl aluminum (chemical formula: ($C_2H_5$)$_3$Al). In the case of MOCVD deposition using ethyl compounds of Group III elements, the ethyl groups dissociated by thermal decomposition recombine and become ethane (molecular formula: $C_2H_6$) and other volatile components and are exhausted out of the chemical vapor deposition reaction system, so the amount of carbon impurities admixed into the interior of the crystal layer will not be as large as in the case of methyl compounds. Therefore, the resistance will not be as high as that of layers deposited from methyl compounds as starting materials. However, by using an $Al_LGa_{1-L}As$ ($0 \leq L \leq 1$) deposition layer 802b deposited from ethyl compounds of Group III elements as starting materials, there is the effect that indium-containing Group III–V compound semiconductor layers with a homogeneous indium composition can be deposited. Since these are easily dissociated ethyl groups, the probability that the surface of the deposition layer will be covered with carbon-containing residues is low, so one reason for this is thought to be that a clean surface is exposed.

The $Al_LGa_{1-L}As$ ($0 \leq L \leq 1$) layer 802b made from organic ethyl compounds as starting materials can be provided on any plane of the superlattice structure 802a which constitutes the buffer layer 802. For example, it can be disposed between the semi-insulating GaAs substrate 801 and the superlattice structure 802a. In addition, it can be disposed between the superlattice structure 802a and the $Ga_ZIn_{1-Z}As$ ($0<Z \leq 1$) channel layer 803. In addition, it can also be provided on both sides of the superlattice structure 802a. The effect of homogenizing the indium composition in the indium-containing Group III-V compound semiconductors 803 and 804 is greatest in the case wherein the $Al_LGa_{1-L}As$ ($0 \leq L \leq 1$) layer 802b deposited using organic ethyl compounds as starting materials is provided joined upon the superlattice structure 802a. While there is also a method wherein the $Al_LGa_{1-L}As$ ($0 \leq L \leq 1$) layer 802b which uses organic ethyl compounds as starting materials is disposed as being joined to the surface of the substrate 801, the effect of homogenization of the indium composition is lessened the further in distance from the of $Ga_ZIn_{1-Z}As$ channel layer 803 and the $Ga_LIn_{1-L}P$ electron-supply layer 805.

In the event that the $Al_LGa_{1-L}As$ ($0 \leq L \leq 1$) layer 802b which uses organic ethyl compounds as starting materials is provided only on the upper surface of the superlattice structure 802a, either the constituent layer 802-1 or 802-2 is joined to the surface of the semi-insulating GaAs substrate 801 below the substrate 801 side of the superlattice structure 802a regardless of the aluminum composition ratio. The constituent layer (802-1 or 802-2) provided joined to the surface of the semi-insulating GaAs substrate 801 (limited to one layer), if its thickness is greater than that of the other constituent layers, then it is also effective in the aforementioned homogenization of the indium composition and moreover, gives rise to the effect of a buffer layer that suppresses changes in the crystalline quality of the upper layers due to fluctuations in the crystallographic specifications of the substrate crystal.

The $Al_L Ga_{1-L}As$ ($0 \leq L \leq 1$) layer (802-1 or 802-2) with a compensation ratio (=K) within the stipulated range which constitutes the buffer layer 802 of the thirteenth preferred embodiment according to claim 13 of the present invention can be deposited by adjusting the so-called V/III ratio. In an atmospheric-pressure or low-pressure MOCVD deposition reaction system, the V/III ratio is defined to be the ratio of supply of, for example, arsine (chemical formula: $AsH_3$) (=V) to trimethyl gallium (=III) supplied to within the system (see ibid, *J. Crystal Growth*, 55 (1981)). As one example, in an $AsH_3/(CH_3)_3Ga$/hydrogen ($H_2$) low-pressure MOCVD system, under conditions of a deposition temperature of 640° C., deposition pressure of $10^4$ Pascal (Pa), formation is possible with the V/III ratio (=$AsH_3/(CH_3)_3Ga$) in the range from 7 or greater to 40 or less.

The compensation ratio (=K) can be calculated based on the donor density ($N_d$) and the acceptor density ($N_a$). $N_d$ and $N_a$ can be calculated based on the Brooks-Herring formula from the values of the specific resistance, mobility and carrier density which are measured by the Hall effect method at the temperature of liquid nitrogen (77K), for example, (see *Phys. Rev.*, Vol. 164, No. 3 (1967), pp. 1025–1031). With n-type $Al_L Ga_{1-L}As$ ($0 \leq L \leq 1$,) in the state $N_d$ by $N_a/N_d$. With p-type $Al_L Ga_{1-L}As$ wherein $N_a > N_d$, K is given by $N_d/N_a$. N-type or p-type $Al_L Ga_{1-L}As$ ($0 \leq L \leq 1$) with the V/III ratio appropriately selected and the K value preferably in the range 0.9 or greater and 1.0 or less has a particularly high resistance. For example, an undoped GaAs layer deposited by a $(CH_3)_3Ga/AsH_3/H_2$ MOCVD method with a V/III ratio of 20 has a compensation ratio of 1.0, and its carrier density is less than $5 \times 10^{14}$ cm$^{-3}$. Thus, such a high-resistance layer has the effect of giving a buffer layer 802a with a high-resistance superlattice structure which reduces the leakage current.

In the fourteenth preferred embodiment according to claim 14 of the present invention, the superlattice structure 802a is constituted using a p-type undoped GaAs layer obtained by setting the V/III ratio on the relatively low side and which has a compensation ratio (K) in the range 0.9 or greater and 1.0 or less, and a carrier density $5 \times 10^{15}$ cm$^{-3}$ or less as the constituent layer (e.g., 802-1). If p-type GaAs is used, electrons are caught by being bound to holes, and as a result it has the effect of giving a buffer layer constituent layer able to cut off the leakage current. If the carrier (hole) density exceeds $1 \times 10^{15}$ cm$^{-3}$, then pn junctions must be formed in other constituent layers of the superlattice structure (e.g., 802-2), and there are problems in that there are cases wherein the high-speed response of the TEGFET is lost due to increased capacitance. In p-type GaAs with a hole density of $1 \times 10^{13}$ cm$^{-3}$ or less, because of the low hole density within the layer, there are cases wherein sufficient numbers of electrons cannot be captured, obstructing any further decrease in the leakage current. Therefore, with a p-type GaAs layer (e.g., 802-1) forming the superlattice structure 802a, the preferable carrier density is $1 \times 10^{13}$ cm$^{-3}$ or greater and $1 \times 10^{15}$ cm$^{-3}$ or less. More preferable is $5 \times 10^{13}$ cm$^{-3}$ or greater and $1 \times 10^{14}$ cm$^{-3}$ or less.

Moreover, the buffer layer 802 is constituted with an $Al_L Ga_{1-L}As$ ($0 \leq L \leq 1$) layer with a compensation ratio (K) in the range 0.9 or greater and 1.0 or less, and a carrier density $1 \times 10^{15}$ cm$^{-3}$ or less as a separate constituent layer (e.g., 802-2). An aluminum composition ratio (=L) in the range of 0.15 or greater and 0.35 or less is preferable for giving the aforementioned p-type GaAs layer (e.g., 802-1) and a superlattice structure 802a with a low leakage current. More preferable is 0.20 or greater and 0.30 or less. An $Al_L Ga_{1-L}As$ ($0 \leq L \leq 1$) layer having such a suitable aluminum composition ratio has a forbidden band between 0.2 electron-volt (units: eV) and 0.4 eV higher than that of GaAs, so regardless of whether the conduction type is p-type, i-type (high-resistance type) or n-type, it has the effect of reducing the leakage current, but in the case that the aforementioned p-type GaAs layer is to be the other constituent layer, it is preferably a p-type $Al_L Ga_{1-L}As$ layer.

The superlattice structure 802a and the $Al_L Ga_{1-L}As$ ($0 \leq L \leq 1$) layer 802b which uses organic ethyl compounds as starting materials joined thereto can be formed by the MOCVD method or the molecular beam epitaxy (MBE) method or other chemical vapor deposition method. Since a channel layer 803 consisting of a phosphorus-containing Group III–V compound semiconductor and an electron-supply layer 805 must be deposited upon the buffer layer 802, the MOCVD method is preferably used. Other means of forming the epitaxial stacking structure 8A for TEGFET applications using different deposition methods are conceivable, for example, forming the buffer layer 802 by MBE and forming the channel layer 803 and electron-supply layer 805 by MOCVD.

The fifteenth preferred embodiment according to claim 15 of the present invention is characterized in that the $Ga_Z In_{1-Z}As$ ($0 < Z \leq 1$) channel layer 803 is provided joined to the $Al_M Ga_{1-M}As$ ($0 < M \leq 1$) layer 802b which forms part of the buffer layer 802 and which is vapor-deposited with organic ethyl compounds as starting materials. By adopting a constitution wherein it is disposed directly below the indium-containing Group III–V compound semiconductor layer 803, it has the greatest effect in improving the homogeneity of the indium composition. For example, while the homogeneity of the indium composition ratio in the case of forming a channel layer 803 from $Ga_{0.80}In_{0.20}As$ which has an indium composition ratio of 0.20 is roughly ±6% in the case wherein an undoped GaAs layer made from trimethyl gallium as its starting materials is used as the layer upon which deposition is performed, this less than ±2% with this preferred embodiment, and typically improved by ±1% or less. In addition, even in an $Al_M Ga_{1-M}As$ layer using a $(CH_3)_3Al/(C_2H_5)Ga$ starting material system, this has the effect of increasing the homogeneity of the indium composition ratio from roughly ±6% to roughly ±3%. The indium composition ratio of the $Ga_Z In_{1-Z}As$ channel layer or the $Ga_L In_{1-L}P$ electron-supply layer can be determined from the angle of diffraction found from ordinary x-ray diffraction methods, or from the photoluminescence (PL) light emission wavelength.

In particular, in the sixteenth preferred embodiment according to claim 16 of the present invention, the $Al_M Ga_{1-M}As$ ($0 \leq M \leq 1$) layer 802b vapor-deposited using organic ethyl compounds as starting materials is constituted from n-type undoped $Al_M Ga_{1-M}As$ with a carrier density of $5 \times 10^{15}$ cm$^{-3}$ or less. The $Al_M Ga_{1-M}As$ ($0 \leq M \leq 1$) layer 802b with a carrier (electron preferably $5 \times 10^{15}$ cm$^{-3}$ or less has the effect of suppressing the leakage of the operating current flowing in the $Ga_Z In_{1-Z}As$ channel layer 803 into the interior of the buffer layer 802. While even a p-type undoped $Al_MGa_{1-M}As$ layer would have the effect of reducing the leakage current into the buffer layer 802, with a MOCVD method that uses organic ethyl compounds as the starting materials, it is difficult to reduce the admixture of carbon compounds due to the effect of ethyl groups and stably obtain a p-type $Al_MGa_{1-M}As$ layer in the undoped state. In addition, while a p-type $Al_MGa_{1-M}As$ layer can be obtained by means of doping with p-type impurities, if the constitution has an $Al_MGa_{1-M}As$ layer with a large total amount of impurities (=$N_d+N_a$) joined directly below the $Ga_ZIn_{1-Z}As$ channel layer 803, there is a problem in that the photoresponsibility of the source-drain current ($I_{ds}$) becomes large. For this reason, an undoped n-type $Al_MGa_{1-M}As$ ($0 \leq M \leq 1$) layer is most preferably used.

The $Al_MGa_{1-M}As$ ($0 \leq M \leq 1$) layer 802b deposited using organic ethyl compounds as described above has a low carbon impurity content and its resistance value is typically low compared to that of crystal layers made from organic methyl compounds. Therefore, if the thickness of the $Al_MGa_{1-M}As$ layer deposited using organic ethyl compounds is excessively large, there is a problem in that this invites a result wherein the leakage current into the buffer layer 802 is increased. Thus, the thickness of the $Al_MGa_{1-M}As$ layer is preferably 100 nm or less. Control of the layer thickness is performed by controlling the film formation time. In particular, in the seventeenth preferred embodiment according to claim 17 of the present invention, the thickness of the $Al_MGa_{1-M}As$ ($0 \leq M \leq 1$) layer 802b vapor-deposited using organic ethyl compounds as starting materials is made to be no thicker than either of the $Al_LGa_{1-L}As$ ($0 \leq L \leq 1$) layers (802-1 or 802-2) with a different aluminum composition ratio (L) vapor-deposited using organic methyl compounds as starting materials which constitute the superlattice structure 802a. For example, joined to the superlattice structure 802a consisting of an $Al_LGa_{1-L}As$ layer with a thickness of 5 nm is an $Al_MGa_{1-M}As$ ($0 \leq M \leq 1$) layer 802b deposited using organic ethyl compounds with a thickness of 50 nm or less. An n-type $Al_MGa_{1-M}As$ ($0 \leq M \leq 1$) layer 802b with such a thickness has the effect of reducing the hysteresis of the $I_{ds}$ and also exhibits the effect of increasing the stability of $g_m$.

In the eighteenth preferred embodiment according to claim 18 of the present invention, the aluminum composition ratio (M) of the n-type $Al_MGa_{1-M}As$ layer 802b vapor-deposited using organic ethyl compounds as starting materials is set to be no greater than the aluminum composition ratio (L) of either of the $Al_LGa_{1-L}As$ ($0 \leq L \leq 1$) layers (802-1 or 802-2) which constitute the superlattice structure 802a. The aluminum composition (=M) is to be preferably no greater than 0.4 so as not to give an indirect-transition type semiconductor. It is preferably no greater than 0.3. The optimal aluminum composition ratio is 0, namely a GaAs constitution. The aluminum composition ratio (=M) can be controlled, for example, by adjusting the ratio of the amount of $(C_2H_5)_3Al$ to the total amount triethyl aluminum (chemical formula: $(C_2H_5)_3Al$) and triethyl gallium (chemical formula: $(C_2H_5)_3Ga$) supplied to the MOCVD deposition system. A buffer layer 802 to which an n-type $Al_MGa_{1-M}As$ layer 802b having such a suitable aluminum composition ratio is joined has the effect of providing a high electron mobility field effect transistor with low photoresponsibility and a small current loop width in $I_{ds}$.

Figure 8:
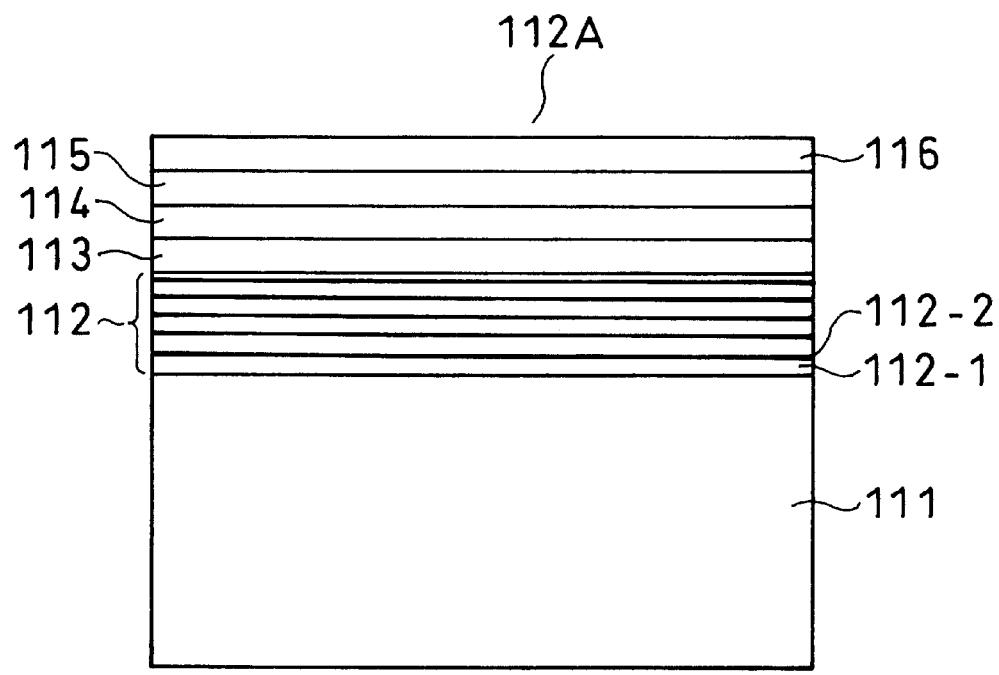
FIG. 8 is a schematic cross section of the epitaxial structure for a GaInP TEGFET used to explain a preferred embodiment of the present invention.

FIG. 8 is a schematic cross section of the epitaxial stacking structure 112A for conceptually explaining the nineteenth preferred embodiment according to claim 19 of the present invention. In the working of this embodiment, a semi-insulating GaAs single crystal with a {100} crystal plane as its primary plane can be used as the substrate 111. A semi-insulating GaAs single crystal with a {100} plane as its primary plane which has a surface inclined by an angle of roughly ±10° in the [110] crystal direction from the {100} plane can also be used as the substrate 111. In addition, a GaAs single crystal with a room-temperature resistivity (specific resistance) of $10^7$ ohm-centimeter (units: Ω·cm) can be preferably used as the substrate 111.

The buffer layer 112 upon the surface of the substrate 111 is constituted from a superlattice period structure consisting preferably of an undoped $Al_LGa_{1-L}As$ ($0 \leq L \leq 1$) layer vapor-deposited by the MOCVD method using trimethyl gallium (($CH_3)_3Ga$) or other trialkyl gallium compound as the gallium (Ga) source. The methyl groups added to the trimethyl gallium compound become the source of carbon impurities admixed into the interior of the $Al_LGa_{1-L}As$ ($0 \leq L \leq 1$) layer, thereby electrically compensating for residual donors within the layer, and having the meritorious effect of giving an $Al_LGa_{1-L}As$ ($0 \leq L \leq 1$) layer which has a high resistance in the undoped state. Therefore, if a trimethyl gallium compound is used as the starting material, a high-resistance buffer layer can be readily constituted. Even with a gallium compound which is a trialkyl gallium compound with three added hydrocarbon groups wherein two added groups are methyl groups, a similar meritorious effect may be obtained, but the efficacy is weaker than that of a trimethyl gallium compounds. In the event that a diethyl methyl gallium compound is used as the gallium source, for example, the efficacy of the adoption of high resistance due to the electrical compensation effect of carbon impurities becomes even weaker.

The superlattice structure is constituted by stacking a repeated pattern of $Al_LGa_{1-L}As$ ($0 \leq L \leq 1$) layers with mutually differing aluminum composition ratios (=L). It can be constituted with a periodically stacked structure of $Al_{0.3}Ga_{0.7}As$ which has an aluminum composition ratio of 0.3 and GaAs which has an aluminum composition ratio equivalent to 0, for example. In addition, it can be constituted with a periodically stacked structure of $Al_{0.1}Ga_{0.9}As$ and aluminum arsenide (chemical formula: AlAs), for example. In a periodically stacked structure with a multi-layer structure consisting of two layers with different aluminum composition ratios, the appropriate thickness of the constituent layers 112-1 and 112-2 is 10 nanometers (units: nm) or greater and 100 nm or less. The constituent layers 112-1 and 112-2 are preferably high-resistance layers with a carrier density less than $5 \times 10^{14}$ $cm^{-3}$. The number of stacking periods is preferably 2 or greater and more preferably 5 or greater. A high-resistance buffer layer consisting of a superlattice structure with a heterojunction constitution constituting 5 or more stacking periods of multi-layer units consisting of $Al_LGa_{1-L}As$ ($0 \leq L \leq 1$) layers with different aluminum composition ratios has a meritorious effect of suppressing the propagation of dislocations or the like from the substrate 111 to the channel layer 114 and other upper layers, and thus gives the effect of providing a $Ga_ZIn_{1-Z}As$ channel layer 114 with a low crystal defect density and high quality, and that has a superior surface flatness.

The GaAs layer made from triethyl gallium (chemical formula: $(C_2H_5)_3Ga$) as the starting material stacked upon the buffer layer 112 constituting the superlattice structure can be deposited by the MOCVD method using a $(C_2H_5)_3Ga$/arsine ($AsH_3$)/hydrogen ($H_2$) reaction system. By using a GaAs deposition layer 113 which uses the ethyl compound $(C_2H_5)_3Ga$ as the gallium source, there is the effect that indium-containing Group III–V compound semiconductor layers with a homogeneous indium composition can be deposited. The ethyl groups dissociated by thermal decomposition recombine and become ethane (molecular formula: $C_2H_6$) and other volatile components and are exhausted out of the chemical vapor deposition reaction system, so the probability that the surface of the deposition layer will be covered with carbon-containing residues is low, so one reason for this is thought to be that a clean surface is exposed.

If triethyl gallium is used as the starting material, the amount of carbon impurities admixed into the interior of the GaAs layer is reduced and the carrier density in the undoped state is typically higher than that of a GaAs layer that uses trimethyl gallium as the starting material. For example, when the ratio of the concentrations of $AsH_3/(CH_3)_3Ga$ supplied to a MOCVD reaction system (the so-called V/III ratio) is set to the same 10.0, with trimethyl gallium, a high-resistance GaAs layer suitable for constituting the buffer layer 112 with a p-type carrier density of $5 \times 10^{13}$ cm$^{-3}$ undoped is recrystallized. In contrast, with triethyl gallium, a GaAs layer with n-type conductivity and a carrier density one order of magnitude greater results. If an extremely thick layer exhibiting such conductivity is disposed directly below the $Ga_ZIn_{1-Z}As$ channel layer 114, the leakage current of the channel layer 114 only increases. Therefore, the thickness of the GaAs layer 113 made from triethyl gallium as its starting material is preferably a thickness between several nm and roughly 100 nm. To give better results, the thickness of the GaAs layer 113 should be made thinner the higher the carrier density. For example, for an n-type GaAs layer 113 with a carrier density of $1 \times 10^{15}$ cm$^{-3}$, the maximum preferable density is 30 nm.

Upon the GaAs layer 113 made from triethyl gallium as its starting material are successively deposited a $Ga_ZIn_{1-Z}As$ channel layer 114 and a $Ga_YIn_{1-Y}P$ electron-supply layer 116. The GaAs layer 113 made from triethyl gallium as its starting material has the effect of improving the homogeneity of the indium composition of the indium-containing Group III–V compound semiconductor layers forming the upper layers 114–116 to within ±2%. Indium-containing Group III–V compound semiconductor layers wherein the indium composition deteriorates to above ±2% become an obstacle to obtaining TEGFETs with a homogeneous pinch-off voltage and transconductance ($g_m$). In addition, even in $Al_CGa_{1-C}As$ layers ($0<C \leq 1$) made from triethyl gallium as their starting material, while they have the effect of making indium-containing Group III–V compound semiconductor layers with upper layers having superior homogeneity of the indium composition, if aluminum (Al)-containing crystal layers are disposed, there is a problem in that photoresponsiveness in the drain current (see G. J. Ree, ed., *Semi-Insulating III–V Materials*, (Shiva Pub. Ltd. (Kent, UK, 1980), pp. 349–352)) and "hysteresis" of the source-drain current (see Makoto Kikuchi, Yasuhiro Tarui, eds., "Illustrated Semiconductor Dictionary," (Nikkan Kogyo Shimbunsha, Jan. 25, 1978), p. 238) and "kinks" readily occur (JP-A-10-247727 and JP-A-10-335350).

In the twentieth preferred embodiment according to claim 20 of the present invention, the channel layer 114 consisting of $Ga_ZIn_{1-Z}As$ with a small surface roughness described therein can be formed with the GaAs layer 113 in particular as the substrate layer, and using a MOCVD method using a trimethyl compound in particular as the source of the Group III constituent element. A MOCVD method using a trimethyl compound as the source of the Group III constituent element is defined to have the meaning of an atmospheric-pressure or low-pressure MOCVD method using a trimethyl compound of at least one Group III element of gallium or indium, for example, trimethyl gallium (($CH_3)_3Ga$) as the gallium source, trimethyl indium (chemical formula: ($CH_3)_3In$) as the indium source. In particular, cyclopentadienyl indium (chemical formula: $C_5H_5In$) which has a bond valence of monovalent can be used. With a ($CH_3)_3Ga/(CH_3)_3In/AsH_3/H_2$ reaction system, upon the GaAs layer 113 made of triethyl gallium as its starting material can be formed a $Ga_ZIn_{1-Z}As$ layer 114 with a homogeneity in the indium composition ratio of ±1% or less. Homogeneity of the indium composition is defined to be given as the value found by dividing the difference between the maximum value and minimum value of the indium composition by a value which is twice the average value of the indium composition. In a ($C_2H_5)Ga/(CH_3)_3In/AsH_3/H_2$ reaction system, the homogeneity of the indium composition of the $Ga_ZIn_{1-Z}As$ layer is typically considered to be poor at roughly ±6%.

In addition, by means of a MOCVD method using a trimethyl compound as the source of the Group III constituent element, upon the GaAs layer 113 made from triethyl gallium as its starting material is obtained a flat $Ga_ZIn_{1-Z}As$ layer which has a superior homogeneity of indium composition and also a low surface roughness due to segregation of indium or the like. If the surface roughness is expressed in terms of haze (regarding haze, see Takao Abe, "Silicon Crystal Growth and Wafer Working," (published by Baifukan, May 20, 1994, first edition), pp. 322–326), then the GaAs layer 113 made from triethyl gallium as its starting material also has the effect of reducing the haze of the upper indium-containing Group III–V compound semiconductor layers 114–116. The spacer layer 115 with a flat joining surface can be joined upon the channel layer 114 which has a low surface roughness, namely little haze and thus its layer thickness has become homogeneous. If the joining surface is flat, then it has an advantage in that the two-dimensional electron gas can be localized in a region in the vicinity of the junction region of the channel layer 114. In order to give a heterojunction interface suited to the efficient localization of a two-dimensional electron gas, the haze should be preferably 60 parts per million (ppm) or less. In a channel layer consisting of a $Ga_ZIn_{1-Z}As$ layer having a surface roughness in excess of 60 ppm as haze, the junction interface with the spacer layer lacks flatness and becomes chaotic, so the electron mobility thus obtained also becomes heterogeneous, and as a result, GaInP TEGFETs with a high transconductance ($g_m$) are not obtained.

In the twenty-first preferred embodiment according to claim 21 of the present invention, a spacer layer 115 is constituted from a $Ga_XIn_{1-X}P$ ($0<X \leq 1$) layer formed by means of a MOCVD method using a trimethyl compound as the source of the Group III constituent element. As described above, upon the GaAs layer 113 made from triethyl gallium as its starting material can be constituted a channel layer 114 consisting of a $Ga_ZIn_{1-Z}As$ layer which has a superior homogeneity of indium composition. Upon the channel layer 114 which has a homogenous indium composition can be stacked a $Ga_XIn_{1-X}P$ ($0<X \leq 1$) spacer layer 115 which has a superior homogeneity of indium composition. Moreover, with a low-pressure or atmospheric-pressure MOCVD method based on a ($CH_3)_3Ga/(CH_3)_3In/AsH_3$ reaction system, a $Ga_XIn_{1-X}P$ ($0<X \leq 1$) layer with even more superior homogeneity can be obtained. A $Ga_XIn_{1-X}P$ layer with a homogeneity in the indium composition ratio of less than ±1% is well suited to practical use as a spacer layer.

In addition, with a low-pressure or atmospheric-pressure MOCVD method based on a ($CH_3)_3Ga$ starting material system, in addition to the homogeneity of the indium composition ratio, a spacer layer 115 with an even more superior surface flatness can be provided. For example, with a $(CH_3)_3Ga/(CH_3)_3In/AsH_3/H_2$ reaction system, at the time of deposition of the spacer layer 115, the haze at the surface of the spacer layer 115 can be made 100 ppm or less, so a spacer layer 115 which can join to the electron-supply layer 116 with a flat junction surface is provided. If the haze of the surface of the $Ga_XIn_{1-X}P$ spacer layer 115 exceeds 100 ppm, then differences in the thickness of the spacer layer 115 due to regions lacking in surface flatness become conspicuous. For this reason, the distance by which the channel layer 114 and electron-supply layer 116 are spatially separated becomes different depending on the region, so the degree of ionization scattering received by the two-dimensional electron gas within the channel layer 114 becomes heterogeneous. Therefore, a problem occurs in that the mobility of the two-dimensional electron gas obtained changes depending on the region.

The carrier density in the $Ga_XIn_{1-X}P$ ($0<X\leq1$) layer constituting the spacer layer 115 is preferably less than $1\times10^{16}$ cm$^{-3}$. The lower the carrier density the better, and depending on the case, even high-resistance is not a problem. The conduction type of the spacer layer 115 is preferably n-type. A thickness of between 1 nm and 15 nm is typically suitable. As the thickness of the spacer layer 115 becomes thicker, the electron mobility exhibited by the two-dimensional electron gas increases, but conversely, the sheet carrier density decreases. For a $Ga_YIn_{1-Y}P$ electron-supply layer with a carrier density of $2\times10^{18}$ cm$^{-3}$, a layer thickness that gives a sheet carrier density of $1.5\times10^{12}$ cm$^{-2}$ is preferable. The sheet carrier density is found by the ordinary Hall effect measurement method.

In the twenty-second preferred embodiment according to claim 22 of the present invention, an electron-supply layer 116 is constituted from an n-type $Ga_YIn_{1-Y}P$ ($0<Y\leq1$) layer with a surface haze of 200 ppm or less. A $Ga_YIn_{1-Y}P$ layer having such a surface roughness can be formed from trimethyl gallium (($CH_3)_3Ga$) or trimethyl indium (($CH_3)_3In$) as the Group III constituent starting material, disposed upon a lower layer of a GaAs layer 113 made from triethyl gallium as its starting material. By using a reaction system which uses trimethyl compounds for both the gallium source and the indium source, a $Ga_YIn_{1-Y}P$ layer with an even lower surface roughness can be obtained even more stably. Haze can be measured by measuring the intensity of scattering of incident laser light or other means. The thickness of the electron-supply layer 116 should be 20–40 nm.

The electron-supply layer 116 is preferably constituted from $Ga_YIn_{1-Y}P$ ($0<Y\leq1$) doped with n-type impurities. A particularly preferable electron-supply layer 116 can be constituted from a $Ga_{0.51}In_{0.49}P$ crystal layer with an indium composition ratio ($=1-Y$) of 0.49. Since $Ga_{0.51}In_{0.49}P$ matches the lattice of GaAs, a GaAs contact layer with few crystal defects arising from lattice mismatching can be constituted as the upper layer. Suitable n-type impurities for doping into $Ga_{0.51}In_{0.49}P$ include silicon (element symbol: Si) which has a small diffusion coefficient. The carrier density of the $Ga_{0.51}In_{0.49}P$ electron-supply layer 116 is preferably $2-3\times10^{18}$ cm$^{-3}$. The carrier density can be measured by means of the ordinary capacitance-voltage (C-V) method. The $Ga_YIn_{1-Y}P$ electron-supply layer with a low surface roughness and superior homogeneity of indium composition has a superior homogeneity of carrier density, so it also has the effect of homogenizing the sheet carrier density mainly involving the two-dimensional electron gas.

In the twenty-third preferred embodiment according to claim 23 of the present invention, at the time of formation of the indium-containing Group III–V compound semiconductor layers with superior surface haze by means of metal-organic chemical vapor deposition, cyclopentadienyl indium (chemical formula: $C_5H_5In(I)$) which has a bond valence of monovalent is used as the indium source (see J. Electron. Mater., 25(3) (1996), pp. 407–409). Since $C_5H_5In(I)$ exhibits the properties of a Lewis base, the polymerization reaction with arsine (chemical formula: $AsH_3$) or phosphine (chemical formula: $PH_3$) as the representative source of Group V elements can be suppressed within the chemical vapor deposition environment (see J. Crystal Growth, 107 (1991), pp. 360–354). For this reason, since the occurrence of organic indium-phosphorus polymers, for example, is suppressed (see J. Chem. Soc., [1951] (1951), pp. 2003–2013), the homogeneity of the indium composition is superior, and so it is essentially superior in obtaining indium-containing Group III–V compound semiconductor vapor-deposited layers.

In addition, $C_5H_5In(I)$ has a lower vapor pressure (sublimation pressure) than that of trimethyl indium (($CH_3)_3In$) and its film formation rate is lower, so it is particularly suited to the formation of the $Ga_ZIn_{1-Z}As$ channel layer 114, $Ga_XIn_{1-X}P$ spacer layer 115, electron-supply layer 116 and other and thin-film layers. In order to induce a sublimation pressure suited to thin-film formation, the $C_5H_5In(I)$ should preferably be kept in an approximate temperature range from 40° C. to 70° C. An example of a companion gas accompanying the vapor of sublimed $C_5H_5In(I)$ is hydrogen.

The twenty-seventh preferred embodiment is related particularly to a high-electron-mobility field effect transistor fabricated using the aforementioned GaInP epitaxial stacking structure.

The above is a description of the preferred embodiments of the present invention and here follows a more detailed description of the present invention by means of working examples, but the present invention is in no way limited to these working examples.

Working Example 1

Figure 3:
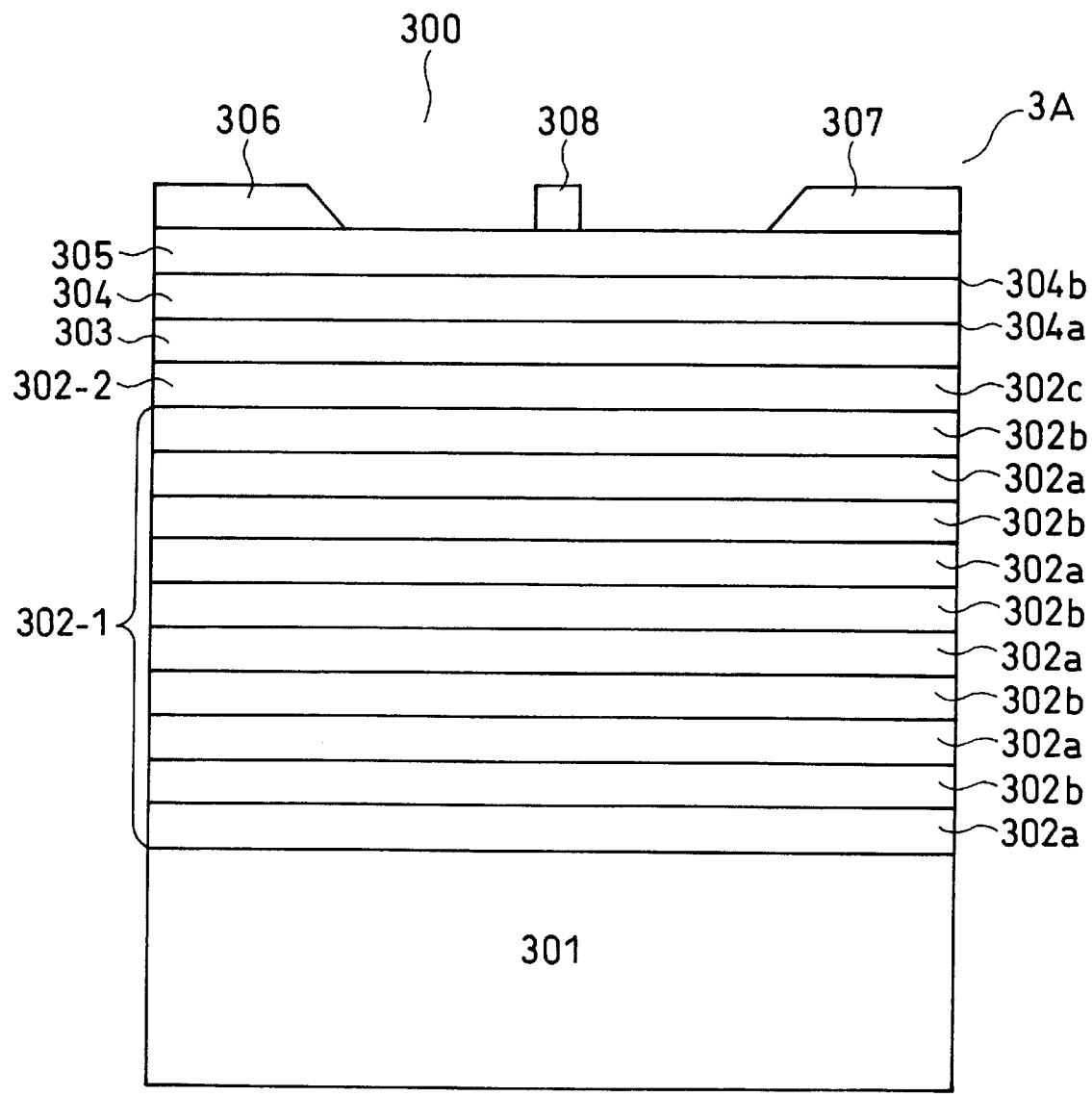
FIG. 3 is a schematic cross section of a GaInP TEGFET used to explain a preferred embodiment of the present invention.

In this working example, the present invention is described in detail using the case of constituting a GaInP two-dimensional electron gas field effect transistor by means of the MOCVD method as an example. FIG. 3 is a schematic cross section of a TEGFET 300 according to this working example.

The epitaxial stacking structure 3A for a TEGFET 300 application uses an undoped semi-insulating (100) 2° off GaAs single crystal as a substrate 301. The specific resistance of the GaAs single crystal used as the substrate 301 is $3\times10^7$ Ω·cm. Upon the surface of the substrate 301 with a diameter of 100 mm is deposited an $Al_LGa_{1-L}As/GaAs$ superlattice structure as a constituent part 302-1 of the first buffer layer constituting the buffer layer 302. The superlattice structure 302-1 consists of an undoped $Al_{0.30}Ga_{0.70}As$ layer 302a with an aluminum composition ratio ($=L$) of 0.30 and an undoped p-type GaAs layer 302b. The carrier density of the $Al_{0.30}Ga_{0.70}As$ layer 302a is $1\times10^{14}$ cm$^{-3}$ and its thickness is 45 nm. The carrier density of the p-type GaAs layer 302b is $7\times10^{13}$ cm$^{-3}$ and its thickness is 50 nm. The number of stacking periods of the $Al_{0.30}Ga_{0.70}As$ layer 302a and p-type GaAs layer 302b is 5 periods. The $Al_{0.30}Ga_{0.70}As$ layer 302a and the p-type GaAs layer 302b were all formed at 640° C. by means of the low-pressure MOCVD method based on a $(CH_3)_3Ga/(CH_3)_3Al/AsH_3/H_2$ reaction system. The pressure at the time of film formation was $1.3\times10^4$ Pascal (Pa). Hydrogen was used as the carrier (transport) gas.

Upon the constituent part 302-1 of the first buffer layer 302 is stacked a GaAs layer 302c deposited by means of a $(C_2H_5)_3Ga/AsH_3/H_2$ reaction system low-pressure MOCVD method using triethyl gallium $((C_2H_5)_3Ga)$ as the gallium (Ga) source, forming a second buffer layer constituent part 302-2. The film formation temperature was 640° C. and the pressure at the time of formation was $1.3 \times 10^4$ Pa. The carrier density of the undoped n-type GaAs layer 302c is $2 \times 10^{15}$ cm$^{-3}$ and its thickness is 20 nm.

Upon the second buffer layer constituent part 302-2 is stacked an undoped n-type $Ga_{0.80}In_{0.20}As$ layer deposited by means of a low-pressure MOCVD method using a $(CH_3)_3Ga/C_5H_5In/AsH_3/H_2$ reaction system as a channel layer 303. The carrier density of the $Ga_{0.80}In_{0.20}As$ layer constituting the channel layer 303 is $1 \times 10^{15}$ cm$^{-3}$ and its thickness is 13 nm. The homogeneity of the indium composition ratio was found to be 0.20 (±0.4%) from the homogeneity of the photoluminescence (PL) wavelength. The haze value of the surface of this layer 303 measured from the intensity of scattering of incident laser light was found to be 12 ppm.

Upon the $Ga_{0.80}In_{0.20}As$ channel layer 303 is stacked an electron-supply layer 304 consisting of a silicon (Si) doped n-type $Ga_{0.51}In_{0.49}P$ deposited by means of a low-pressure MOCVD method using a $(CH_3)_3Ga/C_5H_5In/PH_3/H_2$ reaction system with a gradient composition in the gallium composition ratio (=Y). The gallium composition ratio (=Y) of the electron-supply layer 304 at the junction interface 304a with the undoped n-type $Ga_{0.80}In_{0.20}As$ channel layer 303 was set to 0.88. The gallium composition ratio (=Y) of the electron-supply layer 304 at the junction interface 304b with the n-type GaAs contact layer 305 was set to 0.51. The gradient in this gallium composition ratio was given by uniformly and linearly reducing the ratio of $C_5H_5In$ to $(CH_3)_3Ga$ (= $C_5H_5In/(CH_3)_3Ga$) supplied to the MOCVD reaction system over time during the film-formation period for depositing the electron-supply layer 304 to a thickness of 25 nm. A hydrogen-disilane $(Si_2H_6)$ gas mixture (concentration of 10 ppm by volume) was used as the source of Si for doping. The carrier density of the electron-supply layer 304 is $2 \times 10^{18}$ cm$^{-3}$ and its thickness is 25 nm. The homogeneity of the indium composition ratio was found to be 0.51 (10.5%) from the homogeneity of the photoluminescence (PL) wavelength. The haze value after stacking this layer 304 was found to be 18 ppm.

Upon the surface of the electron-supply layer 304 consisting of n-type $Ga_{0.51}In_{0.49}P$ is stacked a contact layer 305 consisting of Si-doped n-type GaAs by means of a $(CH_3)_3Ga/AsH_3/H_2$ reaction system. The aforementioned hydrogen-disilane $(Si_2H_6)$ gas mixture was used as the source of Si for doping. The carrier density of the n-type GaAs contact layer 305 is $2 \times 10^{18}$ cm$^{-3}$ and its thickness is 100 nm. The haze of the surface of the n-type GaAs contact layer 305 was measured to be 23 ppm. After the completion of epitaxial deposition of the constituent layers 303–305 forming the epitaxial stacking structure 3A, it was heated to 500° C. in an arsine $(AsH_3)$-containing atmosphere, and thereafter cooled to room temperature in a hydrogen atmosphere.

An ohmic electrode consisting of an indium-tin (In—Sn) alloy was formed on the surface of the n-type GaAs contact layer 305 which forms the uppermost surface layer of the epitaxial stacking structure 3A. Next, the ordinary Hall effect measurement method was used to measure the electron mobility of the two-dimensional electron gas which travels through the two-dimensional electron gas channel layer 303. The sheet carrier density $(n_s)$ at room temperature (300 Kelvin (K)) was $1.6 \times 10^{12}$ cm$^{-2}$, and the average electron mobility $(\mu_{RT})$ was 5800 (±2%) (cm$^2$/V·s). In addition, the $n_s$ at the temperature of liquid nitrogen (77K) was $1.5 \times 10^{12}$ cm$^{-2}$, and $\mu$ was 22,000 cm$^2$/V·s, so a high electron mobility was exhibited.

After cooling, a patterning method employing known photolithography technology was used to create a recess in the surface of the n-type GaAs contact layer 305 which forms the surface-most layer of the epitaxial stacking structure 3A. Upon the n-type GaAs contact layer 305 which remained as a mesa were formed a source electrode 306 and a drain electrode 307. The source and drain ohmic electrodes 306 and 307 were given a multi-layer structure consisting of gold-germanium (93% Au, 7% Ge by weight), nickel (Ni) and gold (Au) layers. The distance between the source electrode 306 and the drain electrode 307 was 10 μm.

Upon the surface of the $Ga_{0.51}In_{0.49}P$ electron-supply layer 304 exposed in the recess was formed a Schottky junction type gate electrode 308 with a titanium (Ti) lower layer and an aluminum (Al) upper layer. The so-called gate length of the gate electrode 308 was 2 μm.

The DC characteristics of the GaInP TEGFET 300 were evaluated. The saturated source-drain current $(I_{dss})$ when a source/drain voltage of 3 Volts (V) was applied was found to be 70 milliampere (mA). When the drain voltage was swept from 0 V to 5 V, virtually no looping (hysteresis) in the drain current was observed. The room-temperature transconductance $(g_m)$ measured at a source/drain voltage of 3.0 V was high and homogeneous at 160±5 millisiemens (mS)/mm. In addition, the leakage current flowing between the Au—Ge ohmic electrodes formed at an interval of 100 μm exposed upon the surface of the buffer layer 302 was found to be less than 1 μA at 40 V, thus exhibiting high breakdown resistance. For this reason, the drain current pinch-off voltage became 2.38±0.03 V, so a GaInP TEGFET with a homogeneous threshold voltage was obtained.

Working Example 2

In this working example, the present invention is described in detail using as an example the case of constituting a GaInP two-dimensional electron gas field effect transistor (TEGFET) which has a $Ga_YIn_{1-Y}P$ gradient-composition layer of a type different than that in Working Example 1.

The TEGFET of this working example differs in constitution from that of Working Example 1 only in the constitution of the $Ga_YIn_{1-Y}P$ gradient-composition layer; otherwise it has the epitaxial stacking structure illustrated in FIG. 3 using the same epitaxial constituent layers as those of Working Example 1. Thus, here follows a description of this working example made with reference to FIG. 3. In this working example, the electron-supply layer 304 upon the $Ga_{0.80}In_{0.20}As$ channel layer 303 is constituted as a $Ga_YIn_{1-Y}P$ gradient-composition layer with a gradient in the gallium composition ratio such that the gallium composition ratio is 1.0 at the junction interface 304a of the electron-supply layer 304 with the channel layer 303 and 0.51 at the junction interface 304b with the n-type GaAs contact layer 305. The thickness of the $Ga_YIn_{1-Y}P$ gradient-composition electron-supply layer 304 is 25 nm. In the electron-supply layer 304 with an overall thickness of 25 nm, the region wherein the thickness from the junction interface with the channel layer is up to 2 nm consists of $Ga_YIn_{1-Y}P$ wherein the gallium composition ratio (=Y) is set to 1.0, so it is namely GaP. Thereafter, the gallium composition ratio is reduced uniformly and linearly with the passage of time until the thickness of the electron-supply layer 304 becomes 25 nm.

Thereby the gallium composition ratio at the junction interface 304b with the n-type GaAs contact layer 305 was made to be 0.51. The gradient in the gallium composition ratio in the $Ga_YIn_{1-Y}P$ layer constituting the electron-supply layer 304 in this working example was given by uniformly and linearly increasing the amount of $C_5H_5In$ supplied to the MOCVD reaction system during the deposition period when the thickness of the electron-supply layer 304 is from 2 nm to 25 nm, while keeping constant the amount of $(CH_3)_3Ga$ supplied to the MOCVD system. Upon the surface of the $Ga_YIn_{1-Y}P$ electron-supply layer 304 is stacked the same n-type GaAs contact layer 305 as in Working Example 1 to form a GaInP epitaxial stacking structure. The sheet carrier density ($n_s$) at room temperature (300K) measured by means of the ordinary Hall effect measurement method was $1.7 \times 10^{12}$ $cm^{-2}$, and the average electron mobility ($\mu_{RT}$) was 5900 (±3%) ($cm^2/V \cdot s$). In addition, the $n_s$ at the temperature of liquid nitrogen (77K) was $1.6 \times 10^{12}$ $cm^{-2}$, and $\mu$ at 77K was 22,700 $cm^2/V \cdot s$, so the GaInP epitaxial stacking structure provided with the electron-supply layer 304 according to this working example also exhibited a high electron mobility. In addition, virtually no hysteresis (looping) was found in the drain current of a GaInP TEGFET constituted using the same techniques as those recited in Working Example 1. In addition, the room-temperature transconductance ($g_m$) measured at a source/drain voltage of 3.0 V was high and homogeneous at 165±5 millisiemens (mS)/mm.

Working Example 3

In this working example, the present invention is described in detail using the case of constituting a GaInP two-dimensional electron gas field effect transistor (TEGFET) provided with a spacer layer consisting of a $Ga_XIn_{1-X}P$ gradient-composition layer as an example. FIG. 5 is a schematic cross section of a TEGFET 600 according to this working example.

The epitaxial stacking structure 6A for a TEGFET 600 application uses an undoped semi-insulating (100) 2° off GaAs single crystal as a substrate 601. The specific resistance of the GaAs single crystal used as the substrate 601 is $3 \times 10^7$ $\Omega \cdot cm$. Upon the surface of the substrate 601 with a diameter of 100 mm is deposited an $Al_LGa_{1-L}As/GaAs$ superlattice structure which constitutes the buffer layer 602. The superlattice structure consists of an undoped $Al_{0.30}Ga_{0.70}As$ layer with an aluminum composition ratio (=L) of 0.30 and an undoped p-type GaAs layer. The carrier density of the $Al_{0.30}Ga_{0.70}As$ layer is $1 \times 10^{14}$ $cm^{-3}$ and its thickness is 45 nm. The carrier density of the p-type GaAs layer is $7 \times 10^{13}$ $cm^{-3}$ and its thickness is 50 nm. The number of stacking periods of the $Al_{0.30}Ga_{0.70}As$ layer and p-type GaAs layer is 5 periods. The $Al_{0.30}Ga_{0.70}As$ layer and the p-type GaAs layer were all formed at 640° C. by means of the low-pressure MOCVD method based on a $(CH_3)_3Ga/(CH_3)_3Al/AsH_3/H_2$ reaction system. The pressure at the time of film formation was $1.3 \times 10^4$ Pascal (Pa). Hydrogen was used as the carrier (transport) gas.

Upon the buffer layer 602 is stacked an undoped n-type $Ga_{0.80}In_{0.20}As$ layer deposited by means of a low-pressure MOCVD method using a $(CH_3)_3Ga/C_5H_5In/AsH_3/H_2$ reaction system, forming the channel layer 603. The carrier density of the $Ga_{0.80}In_{0.20}As$ layer constituting the channel layer 603 is $1 \times 10^{15}$ $cm^{-3}$ and its thickness is 13 nm.

Upon the $Ga_{0.80}In_{0.20}As$ channel layer 603 is stacked a spacer layer 604 consisting of undoped n-type $Ga_XIn_{1-X}P$ with a gradient in the gallium composition (=X) deposited by means of a low-pressure MOCVD method using a $(CH_3)_3Ga/C_5H_5In/PH_3/H_2$ reaction system. The gallium composition ratio (=X) of the spacer layer 604 at the junction interface 604a with the undoped n-type $Ga_{0.80}In_{0.20}As$ channel layer 603 was set to 0.88. The gallium composition ratio (=X) of the spacer layer 604 at the junction interface 604b with the $Ga_{0.51}In_{0.49}P$ electron-supply layer 605 was set to 0.51. The gradient in this gallium composition ratio was given by uniformly and linearly reducing the ratio of $C_5H_5In$ to $(CH_3)_3Ga$ (= $C_5H_5In/(CH_3)_3Ga$) supplied to the MOCVD reaction system over time during the film-formation period for depositing the electron-supply layer 604 to a thickness of 6 nm.

Upon the $Ga_XIn_{1-X}P$ spacer layer 604 is stacked an electron-supply layer 605 consisting of silicon (Si) doped n-type $Ga_{0.54}In_{0.49}P$ deposited by means of a low-pressure MOCVD method using a $(CH_3)_3Ga/C_5H_5In/PH_3/H_2$ reaction system. A hydrogen-disilane ($Si_2H_6$) gas mixture (concentration of 10 ppm by volume) was used as the source of Si for doping. The pressure at the time of film formation was $1.3 \times 10^4$ Pascal (Pa). The carrier density of the electron-supply layer 605 is $2 \times 10^{18}$ $cm^{-3}$ and its thickness is 25 nm.

Upon the surface of the electron-supply layer 605 consisting of n-type $Ga_{0.51}In_{0.49}P$ is stacked a contact layer 606 consisting of Si-doped n-type GaAs by means of a $(CH_3)_3Ga/AsH_3/H_2$ reaction system. The aforementioned hydrogen-disilane ($Si_2H_3$) gas mixture was used as the source of Si for doping. The carrier density of the n-type GaAs contact layer 606 is $2 \times 10^{18}$ $cm^{-3}$ and its thickness is 100 nm. After the completion of epitaxial deposition of the constituent layers 603–606 forming the epitaxial stacking structure 6A, it was heated to 500° C. in an arsine ($AsH_3$)-containing atmosphere, and thereafter cooled to room temperature in a hydrogen atmosphere.

An ohmic electrode consisting of an indium-tin (In—Sn) alloy was formed on the surface of the n-type GaAs contact layer 606 which forms the surface-most layer of the epitaxial stacking structure 6A. Next, the ordinary Hall effect measurement method was used to measure the electron mobility for the two-dimensional electron gas which travels through the two-dimensional electron gas channel layer 603. The sheet carrier density ($n_s$) at room temperature (300 Kelvin (K)) was $1.6 \times 10^{12}$ $cm^{-2}$, and the average electron mobility ($\mu_{RT}$) was 6100±2% ($cm^2/V \cdot s$). In addition, the $n_s$ at the temperature of liquid nitrogen (77K) was $1.5 \times 10^{12}$ $cm^{-2}$, and $\mu$ was 23,000 $cm^2/V \cdot s$, so a high electron mobility was exhibited.

After cooling, a patterning method employing known photolithography technique was used to create a recess in the surface of the n-type GaAs contact layer 606 which forms the uppermost surface layer of the epitaxial stacking structure 6A. Upon the n-type GaAs contact layer 606 which remained as a mesa were formed a source electrode 607 and a drain electrode 608. The source and drain ohmic electrodes 607 and 608 were given a multi-layer structure consisting of gold-germanium (93% Au, 7% Ge by weight), nickel (Ni) and gold (Au) layers. The distance between the source electrode 607 and the drain electrode 608 was 10 $\mu m$.

Upon the surface of the $Ga_{0.51}In_{0.49}P$ electron-supply layer 605 exposed in the recess was formed a Schottky junction type gate electrode 609 with a titanium (Ti) lower layer and an aluminum (Al) upper layer. The so-called gate length of the gate electrode 609 was 1 $\mu m$.

The DC characteristics of the GaInP TEGFET 600 were evaluated. The saturated source-drain current ($I_{dss}$) when a source/drain voltage of 3 Volts (V) was applied was found to be 68 milliampere (mA). When the drain voltage was swept from 0 V to 5 V, virtually no looping (hysteresis) in the drain current was observed. The room-temperature transconductance ($g_m$) measured at a source/drain voltage of 3.0 V was high and homogeneous at 160±5 millisiemens (mS)/mm. In addition, the leakage current flowing between the Au—Ge ohmic electrodes formed at an interval of 100 $\mu$m exposed upon the surface of the buffer layer 602 was found to be less than 1 $\mu$A at 40 V, thus exhibiting high breakdown resistance. For this reason, the drain current pinch-off voltage became 2.35±0.03 V, so a GaInP TEGFET with a homogeneous threshold voltage was obtained.

Working Example 4

In this working example, the present invention is described detail using as an example the case of constituting a GaInP two-dimensional electron gas field effect transistor (TEGFET) which has a $Ga_XIn_{1-X}P$ gradient-composition layer of a type different than that in Working Example 3.

The TEGFET of this working example differs in constitution from that of Working Example 3 only in the constitution of the $Ga_XIn_{1-X}P$ gradient-composition layer; otherwise it has the epitaxial stacking structure illustrated in FIG. 5 using the same epitaxial constituent layers as those of Working Example 3. Thus, here follows a description of this working example made with reference to FIG. 5. In this working example, the spacer layer 604 upon the $Ga_{0.80}In_{0.20}As$ channel layer 603 is constituted as a $Ga_XIn_{1-X}P$ gradient-composition layer with a gradient in the gallium composition ratio such that the gallium composition ratio is 1.0 at the junction interface 604a of the channel layer 603 with the spacer layer 604 and 0.51 at the junction interface 604b with the $Ga_{0.51}In_{0.49}P$ electron-supply layer 605. The thickness of the $Ga_XIn_{1-X}P$ gradient-composition electron-supply layer 604 is 8 nm. In the spacer layer 604 with an overall thickness of 8 nm, the region wherein the thickness from the junction interface 604a with the channel layer 603 is up to 2 nm consists of $Ga_XIn_{1-X}P$ wherein the gallium composition ratio (=X) is set to 1.0, so it is namely GaP. Thereafter, the gallium composition ratio is reduced uniformly and linearly with the passage of time during the deposition period until the layer thickness reaching 8 nm which is the total thickness of the spacer layer 604. Thereby the gallium composition ratio at the junction interface 604b with the $Ga_XIn_{1-X}P$ electron-supply layer 605 was made to be 0.51. The gradient in the gallium composition (=X) in the $Ga_XIn_{1-X}P$ layer constituting the spacer layer 604 in this working example was given by uniformly and linearly increasing the amount of $C_5H_5In$ supplied to the MOCVD reaction system during the deposition period when the thickness of the spacer layer 604 is from 2 nm to 8 nm, while keeping constant the amount of $(CH_3)_3Ga$ supplied to the MOCVD system.

Upon the surface of the $Ga_XIn_{1-X}P$ spacer layer 604 is stacked the same n-type $Ga_{0.51}In_{0.49}P$ electron-supply layer 605 and GaAs contact layer 606 as in Working Example 1 to form a GaInP epitaxial stacking structure. The sheet carrier density (n,) at room temperature (300K) measured by means of the ordinary Hall effect measurement method was $1.7 \times 10^{12}$ cm$^{-2}$, and the average electron mobility ($\mu_{RT}$) was 6250±3% (cm$^2$/V·s). In addition, the $n_s$ at the temperature of liquid nitrogen (77K) was $1.6 \times 10^{12}$ cm$^{-2}$, and $\mu$ at 77K was 23,500 cm$^2$/V·s, so the GaInP epitaxial stacking structure provided with the spacer layer 604 according to this working example also exhibited a high electron mobility. In addition, virtually no hysteresis (looping) was found in the drain current of a GaInP TEGFET constituted using the same techniques as those recited in Working Example 1. In addition, the room-temperature transconductance ($g_m$) measured at a source/drain voltage of 3.0 V was high and homogeneous at 165±5 millisiemens (mS)/mm.

Working Example 5

In this working example, the present invention is described using as an example the case of constituting a GaInP two-dimensional electron gas field effect transistor (TEGFET) which has the same gradient composition as that of Working Example 3 and which also has a $Ga_XIn_{1-X}P$ (X=0.88→0.51) gradient-composition layer doped with boron (element symbol: B) as a spacer layer.

The TEGFET of this working example differs in constitution from that of Working Example 3 only in the constitution of the $Ga_XIn_{1-X}P$ gradient-composition layer; the other epitaxial constituent layers are the same as those of Working Example 3 so the description of this working example is made with reference to FIG. 5.

In this working example, boron doping is performed only during the period of deposition of the spacer layer 604 described in Working Example 3 upon the $Ga_{0.80}In_{0.20}As$ channel layer 603. Thereby, a boron-doped $Ga_XIn_{1-X}P$ (X=0.88→0.51) spacer layer 604 is formed with the gallium composition ratio (=X) set to 0.88 at the junction interface 604a with the channel layer 603 and set to 0.51 at the junction interface 604b with the $Ga_{0.51}In_{0.49}P$ electron-supply layer 605. Commercial electronics-grade triethylboron $((C_2H_5)_3B)$ was used as the source of boron for doping. In consideration of the fact that the carrier density of the n-type $Ga_XIn_{1-X}P$ gradient-composition layer (X=0.88→0.51) constituting the spacer layer 604 is roughly $1 \times 10^{17}$ cm$^{-3}$, the amount of triethylboron added (doped) to the MOCVD reaction system is set such that the boron atom density becomes $3 \times 10^{17}$ cm$^{-3}$ in the interior of this gradient-composition layer. The carrier density of the $Ga_XIn_{1-X}P$ gradient-composition spacer layer 604 was lowered to below $1 \times 10^{16}$ cm$^{-3}$ by means of the doping of boron according to this working example.

Upon the $Ga_XIn_{1-X}P$ spacer layer 604 is stacked the same n-type $Ga_{0.51}In_{0.49}P$ electron-supply layer 605 and n-type GaAs contact layer 606 as in Working Example 3 to form a GaInP epitaxial stacking structure. The sheet carrier density ($n_s$) at room temperature (300K) measured by means of the ordinary Hall effect measurement method was $1.6 \times 10^{12}$ cm$^{-2}$, and the average electron mobility ($\mu_{RT}$) was 6400 (cm$^2$/V·s). In addition, the $n_s$ at the temperature of liquid nitrogen (77K) was $1.5 \times 10^{12}$ cm$^{-2}$, and $\mu$ at 77K was 24,500 cm$^2$/V·s. Therefore, the GaInP epitaxial stacking structure provided with the boron-doped spacer layer 604 according to this working example exhibited an electron mobility higher than that in the case of Working Example 3. In addition, virtually no hysteresis (looping) was found in the drain current of a GaInP TEGFET constituted using the same techniques as those recited in Working Example 3. In addition, the room-temperature transconductance ($g_m$) measured at a source/drain voltage of 3.0 V was high and homogeneous at 168 millisiemens (mS)/mm.

Working Example 6

Figure 7:
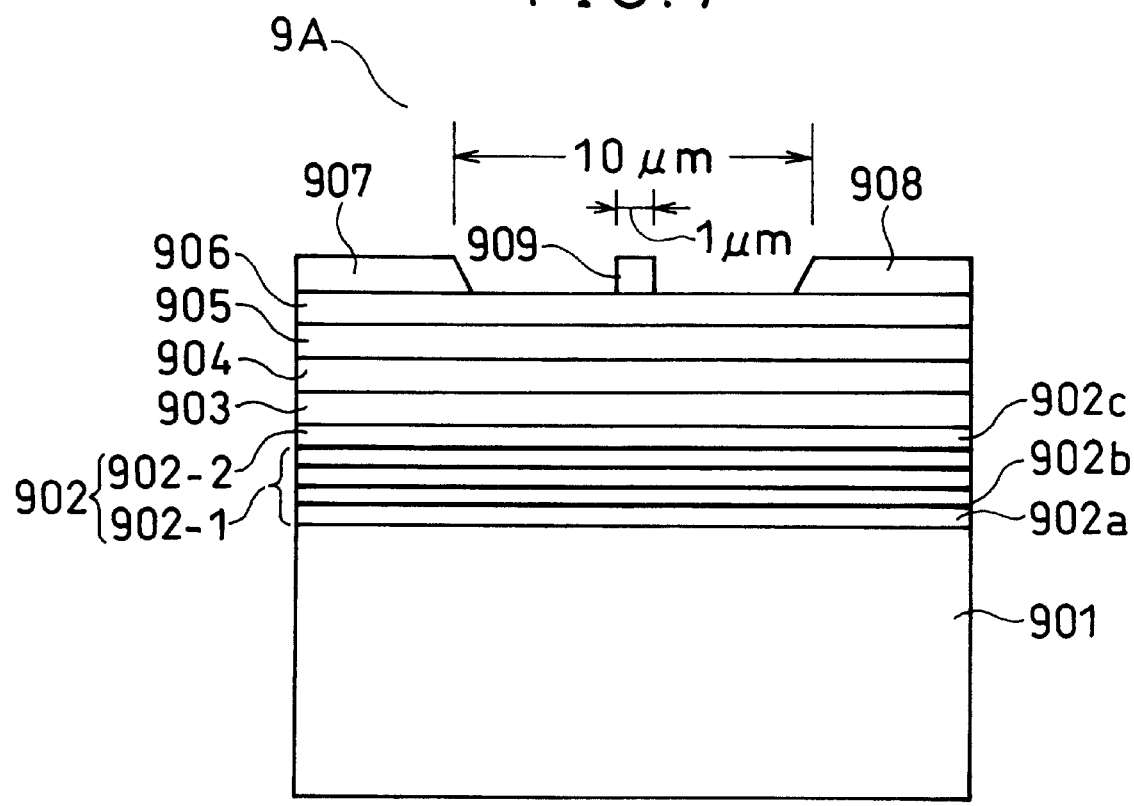
FIG. 7 is a schematic cross section of a GaInP TEGFET used to explain a preferred embodiment of the present invention.

In this working example, the epitaxial stacking structure 9A shown in FIG. 7 is formed upon an undoped semi-insulating (100) 2° off GaAs single-crystal substrate 901. The specific resistance of the GaAs single crystal used as the substrate 901 is $2 \times 10^7$ Ω·cm. Upon the surface of the substrate 901 with a diameter of 100 mm is deposited a constituent part 902-1 of the first buffer layer constituting the buffer layer 902 which has an $Al_LGa_{1-L}As/GaAs$ superlattice structure. The superlattice structure 902-1 consists of an undoped $Al_{0.30}Ga_{0.70}As$ layer 902a with an aluminum composition ratio (=L) of 0.30 and an undoped p-type GaAs layer 902b. The carrier density of the $Al_{0.30}Ga_{0.70}As$ layer 902a is $1\times10^{14}$ cm$^{-3}$ and its thickness is 45 nm. The compensation ratio of the $Al_{0.30}Ga_{0.70}As$ layer 902a is 1.0. The carrier density of the p-type GaAs layer 902b is $7\times10^{13}$ cm$^{-3}$ and its thickness is 50 nm. The compensation ratio of the p-type GaAs layer 902b is 0.98. The number of stacking periods of the $Al_{0.30}Ga_{0.70}As$ layer 902a and p-type GaAs layer 902b is 5 periods. The $Al_{0.30}Ga_{0.70}As$ layer 902a and the p-type GaAs layer 902b were all formed at 640° C. by means of the low-pressure MOCVD method based on a $(CH_3)_3Ga/(CH_3)_3Al/AsH_3/H_2$ reaction system. The pressure at the time of film formation was $1.3\times10^4$ Pascal (Pa). Hydrogen was used as the carrier (transport) gas.

Upon the constituent part 902-1 of the first buffer layer 902 is stacked a GaAs layer 902c deposited by means of a $(C_2H_5)_3Ga/AsH_3/H_2$ reaction system low-pressure MOCVD method with the gallium source changed from $(CH_3)_3Ga$ to triethyl gallium $((C_2HI)_3Ga)$, forming a second buffer layer constituent part 902-2. The film formation temperature was 640° C. and the pressure at the time of formation was $1.3\times10^4$ Pa. The carrier density of the undoped n-type GaAs layer 902 is $2\times10^{15}$ cm$^{-3}$ and its thickness is 20 nm.

Upon the second buffer layer constituent part 902-2 is stacked an undoped n-type $Ga_{0.80}In_{0.20}As$ layer deposited by means of a low-pressure MOCVD method using a $(CH_3)_3Ga/(CH_3)_3In/AsH_3/H_2$ reaction system as a channel layer 903. The carrier density of the $Ga_{0.80}In_{0.20}As$ layer constituting the channel layer 903 is $2\times10^{15}$ cm$^{-3}$ and its thickness is 13 nm. The homogeneity of the indium composition ratio was found to be 0.20±0.5% from the homogeneity of the photoluminescence (PL) wavelength. The haze value of the surface of this layer 903 measured from the intensity of scattering of incident laser light was found to be 13 ppm.

Upon the $Ga_{0.80}In_{0.20}As$ channel layer 903 is stacked a spacer layer 904 consisting of undoped n-type $Ga_{0.51}In_{0.49}P$ by means of a low-pressure MOCVD method using a $(CH_3)_3Ga/(CH_3)_3In/PH_3/H_2$ reaction system. The carrier density of the spacer layer 904 is $1\times10^{15}$ cm$^{-3}$ and its thickness is 3 nm. The roughness of the surface of the spacer layer 904 was found to be 15 ppm as a haze value.

Upon the spacer layer 904 consisting of $Ga_{0.51}In_{0.49}P$ is stacked an electron-supply layer 905 consisting of silicon-doped n-type $Ga_{0.51}In_{0.49}P$ deposited by means of a low-pressure MOCVD method using a $(CH_3)_3Ga/C_5H_5In/PH_3/H_2$ reaction system. A hydrogen-disilane $(Si_2H_6)$ gas mixture (concentration of 10 ppm by volume) was used as the source of Si for doping. The carrier density of the electron-supply layer 905 is $2\times10^{18}$ cm$^{-3}$ and its thickness is 30 nm. The homogeneity of the indium composition of the $Ga_{0.51}In_{0.49}P$ constituting the electron-supply layer 905 was found to be 0.49±0.5% from the homogeneity of the ordinary photoluminescence wavelength. The haze value measured after stacking this layer 905 was found to be 18 ppm.

Upon the surface of the electron-supply layer 905 consisting of n-type $Ga_{0.51}In_{0.49}P$ is stacked a contact layer 906 consisting of Si-doped n-type GaAs by means of a $(CH_3)_3Ga/AsH_3/H_2$ reaction system. The aforementioned hydrogen-disilane gas mixture was used as the source of Si for doping. The carrier density of the contact layer 906 is $2\times10^{18}$ cm$^{-3}$ and its thickness is 100 nm. The haze of the surface of the contact layer 906 was measured to be 23 ppm. After the completion of epitaxial deposition of the constituent layers 903–906 forming the epitaxial stacking structure 9A as such, it was heated to 500° C. in an arsine $(AsH_3)$-containing atmosphere, and thereafter cooled to room temperature in a hydrogen atmosphere.

An ohmic electrode consisting of an indium-tin (In—Sn) alloy was formed on the surface of the n-type GaAs contact layer 906 which forms the uppermost surface layer of the epitaxial stacking structure 9A. Next, the ordinary Hall effect measurement method was used to measure the electron mobility for the two-dimensional electron gas which travels through the two-dimensional electron gas channel layer 903. The sheet carrier density $(n_s)$ at room temperature (300 Kelvin (K)) was $1.6\times10^{12}$ cm$^{-2}$, and the average electron mobility $(\mu_{RT})$ was 5500±9.% (cm$^2$/V·s). In addition, the $n_s$ at the temperature of liquid nitrogen (77K) was $1.4\times10^{12}$ cm$^{-2}$, and $\mu$ was 21,500 cm$^2$/V·s, so a high electron mobility was exhibited.

After cooling, a patterning method employing known photolithography technology was used to create a recess in the surface of the n-type GaAs contact layer 906 which forms the surface-most layer of the epitaxial stacking structure 9A. Upon the n-type GaAs contact layer 906 which remained as a mesa were formed a source electrode 907 and a drain electrode 908. The source and drain ohmic electrodes 907 and 908 were given a multi-layer structure consisting of gold-germanium (93% Au, 7% Ge by weight), nickel (Ni) and gold (Au) layers. The distance between the source electrode 907 and the drain electrode 908 was 10 µm.

Upon the surface of the $Ga_{0.51}In_{0.49}P$ electron-supply layer 905 exposed in the recess was formed a Schottky junction type gate electrode 909 with a multi-layer structure consisting of a titanium (Ti) lower layer and an aluminum (Al) upper layer. The so-called gate length of the gate electrode 909 was 1 µm and the gate width was 150 µm.

The DC characteristics of the GaInP TEGFET, 9A were evaluated. The saturated source-drain current $(I_{dss})$ when a source/drain voltage of 3 Volts (V) was applied was found to be 70 milliampere (mA). When the drain voltage was swept from 0 V to 5 V, virtually no looping (hysteresis) in the drain current was observed. The room-temperature transconductance $(g_m)$ measured at a source/drain voltage of 3.0 V was high and homogeneous at 155±5 millisiemens (mS)/mm. In addition, the leakage current flowing between the Au—Ge ohmic electrodes formed at an interval of 100 µm exposed upon the surface of the buffer layer 902 was found to be less than 1 µA at 40 V, thus exhibiting high breakdown resistance. For this reason, the drain current pinch-off voltage became 2.42±0.03 V, so a GaInP TEGFET with a homogeneous threshold voltage was obtained.

Working Example 7

Figure 9:
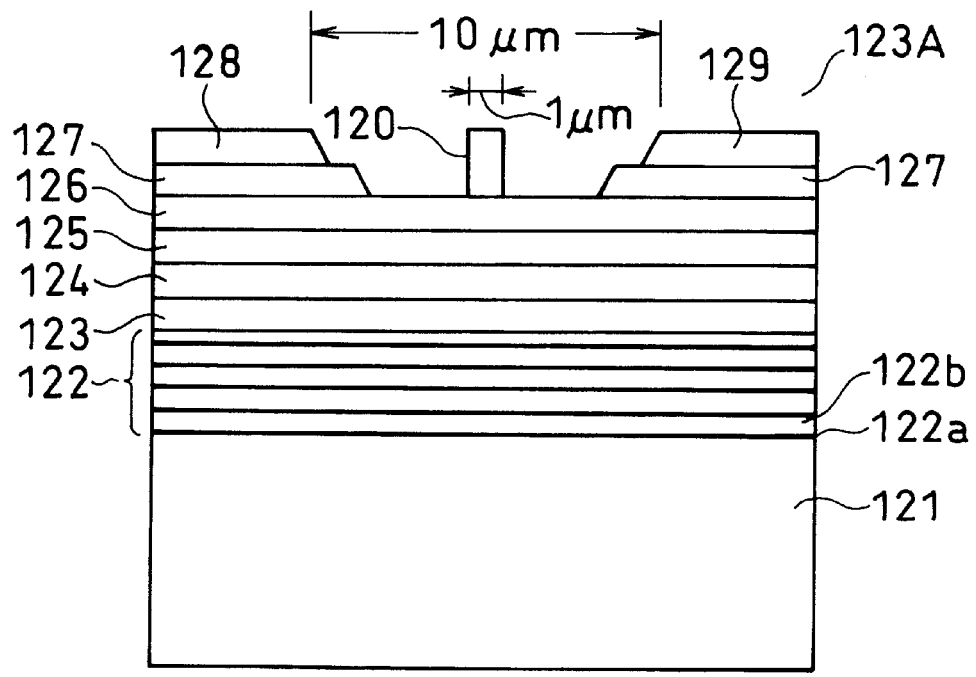
FIG. 9 is a schematic cross section of a GaInP TEGFET recited in a working example.

FIG. 9 is a schematic cross section of the TEGFET, 123A according to this working example.

The epitaxial stacking structure 123A for TEGFET application is formed with an undoped semi-insulating (100) 2° off GaAs single crystal as its substrate 121. The specific resistance of the GaAs single crystal used as the substrate 121 is $3\times10^7$ Ω·cm. Upon the surface of the substrate 121 with a diameter of 100 mm is deposited a buffer layer 122 which has an $Al_LGa_{1-L}As/GaAs$ superlattice structure. The superlattice structure consists of an undoped $Al_{0.30}Ga_{0.70}As$ layer 122a with an aluminum composition ratio (=L) of 0.30 and an undoped p-type GaAs layer 122b. The carrier density of the $Al_{0.30}Ga_{0.70}As$ layer 122a is $1\times10^{14}$ cm$^{-3}$ and its thickness is 45 nm. The carrier density of the p-type GaAs layer 122b is $7\times10^{13}$ cm$^{-3}$ and its thickness is 50 nm. The number of stacking periods of the $Al_{0.30}Ga_{0.70}As$ layer 122a and p-type GaAs layer 122b is 5 periods. The $Al_{0.30}Ga_{0.70}As$ layer 122a and the p-type GaAs layer 122b were all formed at 640° C. by means of the low-pressure MOCVD method based on a $(CH_3)_3Ga/(CH_3)_3Al/AsH_3/H_2$ reaction system. The pressure at the time of film formation was $1\times10^4$ Pascal (Pa). Hydrogen was used as the carrier (transport) gas.

Upon the buffer layer 122 is stacked a GaAs layer 123 deposited by means of a $(C_2H_5)_3Ga/AsH_3/H_2$ reaction system low-pressure MOCVD method using triethyl gallium $((C_2H_5)_3Ga)$ as the gallium source. The film formation temperature was 640° C. and the pressure at the time of formation was $1\times10^4$ Pa. The carrier density of the undoped n-type GaAs layer 123 is $2\times10^{15}$ cm$^{-3}$ and its thickness is 20 nm.

Upon the GaAs layer 123 is stacked an undoped n-type $Ga_{0.80}In_{0.20}As$ layer as the channel layer 124 deposited by means of a low-pressure MOCVD method using a $(CH_3)_3Ga/C_2H_5In/AsH_3/H_2$ reaction system. The carrier density of the $Ga_{0.80}In_{0.20}As$ layer constituting the channel layer 124 is $1\times10^{15}$ cm$^{-3}$ and its thickness is 13 nm. The homogeneity of the indium composition was found to be 0.20±0.4% from the homogeneity of the ordinary photoluminescence (PL) wavelength. The haze value of the surface of this layer 124 measured from the intensity of scattering of incident laser light was found to be 12 ppm.

Upon the $Ga_{0.80}In_{0.20}As$ channel layer 124 is stacked a spacer layer 125 consisting of undoped n-type $Ga_{0.51}In_{0.49}P$ by means of a low-pressure MOCVD method using a $(CH_3)_3Ga/C_5H_5In/PH_3/H_2$ reaction system. The carrier density of the spacer layer 125 is $1\times10^{15}$ cm$^{-3}$ and its thickness is 3 nm. The haze value of the surface of the spacer layer 125 was measured to be 13 ppm.

Upon the spacer layer 125 consisting of $Ga_{0.51}In_{0.49}P$ is stacked an electron-supply layer 126 consisting of Si-doped n-type $Ga_{0.51}In_{0.49}P$ deposited by means of a low-pressure MOCVD method using a $(CH_3)_3Ga/C_5H_5In/PH_3/H_2$ reaction system. A hydrogen-disilane ($Si_2H_6$) gas mixture (concentration of 10 ppm by volume) was used as the source of Si for doping. The carrier density of the electron-supply layer 126 is $2\times10^{18}$ cm$^{-3}$ and its thickness is 25 nm. The homogeneity of the indium composition of the $Ga_{0.51}In_{0.49}P$ constituting the electron-supply layer 126 was found to be 0.49±0.5% from the homogeneity of the ordinary photoluminescence (PL) wavelength. The haze value measured after stacking this layer 126 was found to be 18 ppm.

Upon the surface of the electron-supply layer 126 consisting of n-type $Ga_{0.51}In_{0.49}P$ is stacked a contact layer 127 consisting of Si-doped n-type GaAs by means of a $(CH_3)_3Ga/AsH_3/H_2$ reaction system. The aforementioned hydrogen-disilane gas mixture was used as the source of Si for doping. The carrier density of the contact layer 127 is $2\times10^{18}$ cm$^{-3}$ and its thickness is 100 nm. The haze of the surface of the contact layer 127 was measured to be 23 ppm. After the completion of epitaxial deposition of the constituent layers 122–127 forming the epitaxial stacking structure 123A as such, it was heated to 500° C. in an arsine ($AsH_3$)-containing atmosphere, and thereafter cooled to room temperature in a hydrogen atmosphere.

An ohmic electrode consisting of an indium-tin (In—Sn) alloy was formed on the surface of the n-type GaAs contact layer 127 which forms the uppermost surface layer of the epitaxial stacking structure 123A. Next, the ordinary Hall effect measurement method was used to measure the electron mobility for the two-dimensional electron gas which travels through the two-dimensional electron gas channel layer 124. The sheet carrier density ($n_s$) at room temperature (300 Kelvin (K)) was $1.6\times10^{12}$ cm$^{-2}$, and the average electron mobility ($\mu_{RT}$) was 5800±2% (cm$^2$/V·s). In addition, the $n_s$ at the temperature of liquid nitrogen (77K) was $1.5\times10^{12}$ cm$^{-2}$, and $\mu$ was 22,000 cm$^2$/V·s, so a high electron mobility was exhibited.

After cooling, a patterning method employing known photolithography technique was used to create a recess in the surface of the n-type GaAs contact layer 127 which forms the uppermost surface layer of the epitaxial stacking structure 123A. Upon the n-type GaAs contact layer 127 which remained as a mesa were formed a source electrode 128 and a drain electrode 129. The source and drain ohmic electrodes 128 and 129 were given a multi-layer structure consisting of gold-germanium (93% Au, 7% Ge by weight), nickel (Ni) and gold (Au) layers. The distance between the source electrode 128 and the drain electrode 129 was 10 $\mu$m.

Upon the surface of the $Ga_{0.51}In_{0.49}P$ electron-supply layer 126 exposed in the recess was formed a Schottky junction type gate electrode 120 with a multi-layer structure consisting of a titanium (Ti) lower layer and an aluminum (Al) upper layer. The so-called gate length of the gate electrode 120 was 1 $\mu$m.

The DC characteristics of the GaInP TEGFET, 123A were evaluated. The saturated source-drain current ($I_{dss}$) when a source/drain voltage of 3 Volts (V) was applied was found to be 70 milliampere (mA). When the drain voltage was swept from 0 V to 5 V, virtually no looping (hysteresis) in the drain current was observed. The room-temperature transconductance ($g_m$) measured at a source/drain voltage of 3.0 V was high and homogeneous at 160±5 millisiemens (mS)/mm. In addition, the leakage current flowing between the Au—Ge ohmic electrodes formed at an interval of 100 $\mu$m exposed upon the surface of the buffer layer 122 was found to be less than 1 $\mu$A at 40 V, thus exhibiting high breakdown resistance. For this reason, the drain current pinch-off voltage became 2.38±0.03 V, so a GaInP TEGFET with a homogeneous threshold voltage was obtained.

As is evident from the aforementioned explanation, by means of the invention recited in claim 1, the electron-supply layer required to constitute a GaInP TEGFET manifesting high transconductance is constituted as a $Ga_xIn_{1-x}P$ layer with a gradient in the composition such that the gallium composition ratio decreases in the direction of increasing layer thickness from the channel layer toward the contact layer, so a two-dimensional electron gas efficiently accumulates in the interior of the channel layer, and a high electron mobility is manifested, so a GaInP epitaxial stacking structure with a superior homogeneity in the transconductance and pinch-off voltage can be provided.

By means of the invention recited in claim 2, the n-type $Ga_yIn_{1-y}P$ layer gradient-composition layer is constituted such that the gallium composition ratio is 1.0 at the junction interface with the electron-supply layer and decreases to roughly 0.51 at the junction interface with the n-type GaAs contact layer, so a GaInP epitaxial stacking structure with a superior homogeneity in the transconductance and pinch-off voltage can be provided.

By means of the invention recited in claim 3, an electron-supply layer with superior lattice-matching characteristics with the GaAs single-crystal substrate can be formed within the GaInP epitaxial stacking structure.

By means of the invention recited in claim 4, the n-type $Ga_yIn_{1-y}P$ layer gradient-composition layer is constituted such that the gallium composition ratio is 0.70 or greater at the junction interface with the electron-supply layer and decreases to roughly 0.51 at the junction interface with the n-type GaAs contact layer, so a GaInP epitaxial stacking structure with a superior homogeneity in the transconductance and pinch-off voltage can be provided.

By means of the invention recited in claim 5, by forming a region of the electron-supply layer of a constant thickness from the junction interface with the channel layer as $Ga_YIn_{1-Y}P$ with a constant gallium composition ratio (=Y), a stable junction barrier from the electron-supply layer is given. In addition, a $Ga_YIn_{1-Y}P$ electron-supply layer with superior homogeneity in the indium composition ratio (=1−Y) and superior surface characteristics is given.

As is evident from the aforementioned explanation, by means of the invention recited in claim 6, the spacer layer required to constitute a GaInP TEGFET manifesting high transconductance is constituted as a $Ga_XIn_{1-X}P$ layer with a gradient in the composition such that the gallium composition ratio decreases in the direction of increasing layer thickness from the channel layer toward the contact layer, so a two-dimensional electron gas efficiently accumulates in the interior of the channel layer, and a high electron mobility is manifested, so a GaInP epitaxial stacking structure with a superior homogeneity in the transconductance and pinch-off voltage can be provided.

By means of the invention recited in claim 7, an electron-supply layer with superior lattice-matching characteristics with the GaAs single-crystal substrate can be formed within the GaInP epitaxial stacking structure.

By means of the invention recited in claim 8, the spacer layer is constituted as an n-type $Ga_XIn_{1-X}P$ layer gradient-composition layer such that the gallium composition ratio is 0.70 or greater at the junction interface with the electron-supply layer and decreases toward the junction interface with the $Ga_{0.51}In_{0.49}P$ electron-supply layer, so a GaInP epitaxial stacking structure with a particularly high transconductance can be provided.

By means of the invention recited in claim 9, the spacer layer is constituted as an n-type $Ga_XIn_{1-X}P$ layer gradient-composition layer such that the gallium composition ratio is 1.0 at the junction interface with the electron-supply layer and decreases toward the junction interface with the $Ga_{0.51}In_{0.49}P$ electron-supply layer, so a GaInP epitaxial stacking structure with a particularly high and homogenous transconductance can be provided.

By means of the invention recited in claim 10, the spacer layer is constituted as an n-type $Ga_XIn_{1-X}P$ layer gradient-composition layer such that the gallium composition ratio decreases to 0.51±0.01 at the junction interface with the electron-supply layer, so a GaInP epitaxial stacking structure with a particularly high and homogenous transconductance can be provided.

By means of the invention recited in claim 11, the spacer layer is constituted as a boron-doped, low-carrier density, high-resistance $Ga_XIn_{1-X}P$ gradient-composition layer, so a high-electron-mobility two-dimensional electron gas efficiently accumulates in the interior of the channel layer, so a GaInP epitaxial stacking structure with superior transconductance characteristics can be provided.

By means of the invention recited in claim 12, the buffer layer is constituted as a portion with a superlattice periodic structure consisting of $Al_LGa_{1-L}As$ ($0 \leq L \leq 1$) layers with different aluminum composition ratios (L) vapor-deposited using an organic methyl compound of aluminum or gallium as its starting material, and a portion having $Al_MGa_{1-M}As$ ($0 \leq M \leq 1$) vapor-deposited using an organic ethyl compound of Al or Ga as its starting material touching, so a high-resistance buffer can be constituted, and a method of fabricating a GaInP epitaxial stacking structure with a low leakage current and the epitaxial stacking structure can be provided.

In particular, by means of the invention recited in claim 13, the superlattice periodic structure constituting one part of the buffer layer with a periodic alternating layer structure of $Al_LGa_{1-L}As$ layers vapor-deposited using an organic methyl compound as its starting material and with a stipulated compensation ratio, so a GaInP epitaxial stacking structure with a low leakage current can be provided.

Furthermore, in particular, by means of the invention recited in claim 14, the superlattice periodic structure constituting one part of the buffer layer with a periodic alternating layer structure of $Al_LGa_{1-L}As$ layers and p-type GaAs layers vapor-deposited using an organic methyl compound as its starting material and with a stipulated compensation ratio and carrier density, so a GaInP epitaxial stacking structure with a particularly low leakage current can be provided.

By means of the invention recited in claim 15, an $Al_MGa_{1-M}As$ layer vapor-deposited using an organic ethyl compound as its starting material is provided joined to a $Ga_ZIn_{1-Z}As$ channel layer, so the channel layer can be formed from a $Ga_ZIn_{1-Z}As$ layer which has a homogenous indium composition and also low deterioration in the surface state arising from segregation of indium or the like, so a GaInP epitaxial stacking structure with superior homogeneity in the electron mobility and transconductance, and superior homogeneity in the pinch-off voltage can be provided.

By means of the invention recited in claim 16, an $Al_MGa_{1-M}As$ layer vapor-deposited using an organic ethyl compound as its starting material is formed from n-type $Al_MGa_{1-M}As$ with a stipulated carrier density and thickness, so the channel layer and electron-supply layer can be formed from an indium-containing Group III–V compound semiconductor with a superior homogeneity in its indium composition, so a GaInP epitaxial stacking structure with a homogeneous pinch-off voltage and $g_m$ can be provided.

By means of the invention recited in claim 17, the thickness of the n-type $Al_MGa_{1-M}As$ layer vapor-deposited using an organic ethyl compound as its starting material is set to be no greater than the thickness of the $Al_LGa_{1-L}As$ layer vapor-deposited using an organic ethyl compound as its starting material constituting the superlattice periodic structure, so a GaInP epitaxial stacking structure with particularly low hysteresis in the drain current can be provided.

By means of the invention recited in claim 18, the aluminum composition ratio (M) of the n-type $Al_MGa_{1-M}As$ layer vapor-deposited using an organic ethyl compound as its starting material is set to be no greater than the aluminum composition ratio (L) of any of the $Al_LGa_{1-L}As$ layers which constitute the superlattice periodic structure, so a GaInP epitaxial stacking structure with particularly reduced hysteresis in the drain current can be provided.

By means of the invention recited in claim 19, a GaAs thin-film layer vapor-deposited using triethyl gallium as its starting material is used as the substrate layer when an indium-containing Group III–V compound semiconductor layer is provided, so a $Ga_ZIn_{1-Z}As$ layer which has a superior homogeneity in its indium composition, and a superior surface roughness value, along with a $Ga_XIn_{1-X}P$ spacer layer and electron-supply layer can be formed, and therefore, a method of fabricating a GaInP epitaxial stacking structure with a superior homogeneity in the transconductance and pinch-off voltage and the epitaxial stacking structure can be provided.

By means of the invention recited in claim 20, the channel layer is formed from n-type $Ga_ZIn_{1-Z}As$ with a stipulated surface roughness, so therefore a GaInP epitaxial stacking structure with superior homogeneity in the transconductance and pinch-off voltage can be provided.

By means of the invention recited in claim 21, the spacer layer is formed from n-type $Ga_XIn_{1-X}P$ with a stipulated surface roughness, so therefore a GaInP epitaxial stacking structure with superior homogeneity in the transconductance and pinch-off voltage can be provided.

By means of the invention recited in claim 22, the electron-supply layer is formed from $Ga_YIn_{1-Y}P$ doped with n-type impurities, having a stipulated surface roughness, so therefore a GaInP epitaxial stacking structure with superior homogeneity in the transconductance and pinch-off voltage can be provided.

By means of the inventions recited in claims 23 and 24, the n-type $Ga_ZIn_{1-Z}As$ channel layer, $Ga_XIn_{1-X}P$ spacer layer and electron-supply layer are formed by means of a chemical vapor deposition method using cyclopentadienyl indium as the starting material for indium, so a channel layer, spacer layer and electron-supply layer with superior homogeneity of the indium composition and little surface roughness are formed, and moreover, a method of fabricating a GaInP epitaxial stacking structure and the epitaxial stacking structure with a superior homogeneity in the transconductance and pinch-off voltage can be provided.

By means of the invention recited in claim 26, a field effect transistor with a particularly high electron mobility can be provided.

What is claimed is:

1. A method of fabricating a GaInP epitaxial sacking structure comprising:

stacked upon a GaAs single-crystal substrate, at least a buffer layer, a $Ga_ZIn_{1-Z}As$ ($0<Z\leq1$) channel layer, and a $Ga_YIn_{1-Y}P$ ($0<Y\leq1$) electron-supply layer joined to said channel layer, the GaInP epitaxial stacking structure being characterized in that it includes a region within the electron-supply layer wherein the gallium composition ratio (Y) decreases from a side of the junction interface with the channel layer toward an opposite side, and the buffer layer consisting of a periodic structure of a plurality of $Al_LGa_{1-L}As$ ($0\leq L\leq1$) layers with different aluminum composition ratios (L) and an $Al_MGa_{1-M}AS$ ($0\leq M\leq1$) layer disposed on said periodic structure, said method comprising:

a step wherein the periodic structure of the buffer layer is vapor-deposited using an organic methyl compound of aluminum or gallium as its starting material, a step wherein the $Al_MGa_{1-M}AS$ layer is vapor-deposited using an organic ethyl compound of aluminum or gallium as its starting material in contact with said periodic structure, and a step wherein the channel layer and electron-supply layer are formed by means of a chemical vapor deposition method using cyclopentadienyl indium which has a bond valence of monovalent as the starting material for indium.

2. A method of fabricating a GaInP epitaxial stacking structure comprising:

stacked upon a GaAs single-crystal substrate, at least a buffer layer, a $Ga_ZIn_{1-Z}As$ ($0<Z\leq1$) channel layer, a $Ga_XIn_{1-X}P$ ($0<X\leq1$) spacer layer, and a $Ga_YIn_{1-Y}P$ ($0<Y<1$) electron-supply layer, the GaInP epitaxial stacking structure being characterized in that the channel layer, spacer layer, and electron-supply layer touch each other in this order, and that the GaInP epitaxial stacking structure includes a region within the spacer layer wherein the gallium composition ratio (X) decreases from the side of a junction interface with the channel layer toward the side of the electron-supply layer, and the buffer layer consisting of a periodic structure of a plurality of $Al_LGa_{1-L}As$ ($0\leq L\leq1$) layers with different aluminum composition ratios (L) and an $Al_MGa_{1-M}AS$ ($0\leq M\leq1$) layer disposed on said periodic structure, said method comprising:

a step wherein the periodic structure of the buffer layer is vapor-deposited using an organic methyl compound of aluminum or gallium as its starting material, a step wherein the $Al_MGa_{1-M}AS$ layer is vapor-deposited using an organic ethyl compound of aluminum or gallium as its starting material in contact with said periodic structure, and a step wherein the channel layer, spacer layer and electron-supply layer are formed by means of a chemical vapor deposition method using cyclopentadienyl indium which has a bond valence of monovalent as the starting material for indium.

* * * * *